United States Patent [19]
Collins et al.

[11] Patent Number: 6,165,311
[45] Date of Patent: *Dec. 26, 2000

[54] INDUCTIVELY COUPLED RF PLASMA REACTOR HAVING AN OVERHEAD SOLENOIDAL ANTENNA

[75] Inventors: Kenneth S. Collins, San Jose; Michael Rice, Pleasanton; John Trow, San Jose; Douglas Buchberger, Tracy; Craig A. Roderick, San Jose, all of Calif.

[73] Assignee: Applied Materials, Inc., Santa Clara, Calif.

[*] Notice: This patent is subject to a terminal disclaimer.

[21] Appl. No.: 08/648,254

[22] Filed: May 13, 1996

Related U.S. Application Data

[63] Continuation-in-part of application No. 08/580,026, Dec. 20, 1995, which is a continuation of application No. 08/041,796, Apr. 1, 1993, Pat. No. 5,556,501, which is a continuation of application No. 07/722,340, Jun. 27, 1991, abandoned, and a continuation-in-part of application No. 08/503,467, Jul. 18, 1995, Pat. No. 5,770,098, which is a division of application No. 08/138,060, Oct. 15, 1993, Pat. No. 5,477,975, and a continuation-in-part of application No. 08/597,577, Feb. 2, 1996, Pat. No. 6,077,384, which is a continuation-in-part of application No. 08/521,668, Aug. 31, 1995, abandoned, which is a continuation-in-part of application No. 08/289,336, Aug. 11, 1994, abandoned, which is a continuation of application No. 07/984,045, Dec. 1, 1992, abandoned, and application No. 08/648,256, Mar. 13, 1996, Pat. No. 6,036,877.

[51] Int. Cl.$^7$ ........................................ C23F 1/02
[52] U.S. Cl. .................. 156/345; 118/723 E; 118/723 I; 118/723 IR; 118/723 AN; 216/67; 216/68; 204/192.32; 204/298.31; 204/298.34
[58] Field of Search .............................. 118/723 E, 723 I, 118/723 IR, 723 AN; 216/67, 68; 156/345; 204/192.32, 298.31, 298.34

[56] References Cited

U.S. PATENT DOCUMENTS

| | | | |
|---|---|---|---|
| 4,123,316 | 10/1978 | Tsuchimoto | 438/731 |
| 4,261,762 | 4/1981 | King | 438/514 |

(List continued on next page.)

FOREIGN PATENT DOCUMENTS

| | | |
|---|---|---|
| 0 403 418 A2 | 12/1990 | European Pat. Off. . |
| 0 413 282 A2 | 2/1991 | European Pat. Off. . |
| A1-520 519 | 12/1992 | European Pat. Off. . |
| 0 552 490 A1 | 7/1993 | European Pat. Off. . |
| A1-552-491 | 7/1993 | European Pat. Off. . |
| 0 601 468 A1 | 6/1994 | European Pat. Off. . |
| 0 651 434 A2 | 5/1995 | European Pat. Off. . |
| 0 680 072 | 11/1995 | European Pat. Off. . |

(List continued on next page.)

OTHER PUBLICATIONS

Patent Abstracts of Japan—JP06–196446, Jul. 1994.
Patent Abstract of Japan, Jul. 1994.

(List continued on next page.)

*Primary Examiner*—Rodney McDonald
*Attorney, Agent, or Firm*—Michaelson and Wallace

[57] ABSTRACT

The invention is embodied in an inductively coupled RF plasma reactor including a reactor chamber enclosure defining a plasma reactor chamber and a support for holding a workpiece inside the chamber, a non-planar inductive antenna adjacent the reactor chamber enclosure, the non-planar inductive antenna including inductive elements spatially distributed in a non-planar manner relative to a plane of the workpiece to compensate for a null in an RF inductive pattern of the antenna, and a plasma source RF power supply coupled to the non-planar inductive antenna. The planar inductive antenna may be symmetrical or non-symmetrical, although it preferably includes a solenoid winding such as a vertical stack of conductive windings. In a preferred embodiment, the windings are at a minimum radial distance from the axis of symmetry while in an alternative embodiment the windings are at a radial distance from the axis of symmetry which is a substantial fraction of a radius of the chamber.

64 Claims, 20 Drawing Sheets

U.S. PATENT DOCUMENTS

| | | | |
|---|---|---|---|
| 4,350,578 | 9/1982 | Frieser et al. | 204/192.35 |
| 4,427,516 | 1/1984 | Levinstein et al. | 204/192.3 |
| 4,427,762 | 1/1984 | Takahashi et al. | 430/436 |
| 4,430,547 | 2/1984 | Yoneda et al. | 219/121.4 |
| 4,457,359 | 7/1984 | Holden | 165/80.5 |
| 4,512,391 | 4/1985 | Harra | 165/48.1 |
| 4,565,601 | 1/1986 | Kakehi et al. | 216/59 |
| 4,711,698 | 12/1987 | Douglas | 438/722 |
| 4,755,345 | 7/1988 | Balty et al. | 376/123 |
| 4,756,810 | 7/1988 | Lamont, Jr. et al. | 204/192.3 |
| 4,786,352 | 11/1988 | Benzing | 156/345 |
| 4,786,359 | 11/1988 | Stark et al. | 438/710 |
| 4,793,897 | 12/1988 | Dunfield et al. | 438/724 |
| 4,807,016 | 2/1989 | Douglas | 257/774 |
| 4,810,935 | 3/1989 | Boswell | 315/111.41 |
| 4,842,683 | 6/1989 | Cheng et al. | 156/345 |
| 4,870,245 | 9/1989 | Price et al. | 219/121.36 |
| 4,918,031 | 4/1990 | Flamm et al. | 204/192.32 |
| 4,948,458 | 8/1990 | Ogle | 438/729 |
| 4,948,750 | 8/1990 | Kausche et al. | 118/723 IR |
| 4,990,229 | 2/1991 | Campbell et al. | 204/298.06 |
| 5,000,113 | 3/1991 | Wang et al. | 118/723 E |
| 5,006,220 | 4/1991 | Hijikata et al. | 204/298.33 |
| 5,015,330 | 5/1991 | Okumura et al. | 438/694 |
| 5,074,456 | 12/1991 | Degner et al. | 228/121 |
| 5,085,727 | 2/1992 | Steger | 156/345 |
| 5,169,487 | 12/1992 | Langley et al. | 438/714 |
| 5,187,454 | 2/1993 | Collins et al. | 333/17.3 |
| 5,203,956 | 4/1993 | Hansen | 216/63 |
| 5,241,245 | 8/1993 | Barnes et al. | 315/111.41 |
| 5,249,251 | 9/1993 | Egalon et al. | 385/123 |
| 5,258,824 | 11/1993 | Carlson et al. | 356/382 |
| 5,276,693 | 1/1994 | Long et al. | 372/6 |
| 5,277,751 | 1/1994 | Ogle | 216/70 |
| 5,326,404 | 7/1994 | Sato | 118/723 MR |
| 5,346,578 | 9/1994 | Benzing et al. | 156/345 |
| 5,349,313 | 9/1994 | Collins et al. | 333/131 |
| 5,392,018 | 2/1995 | Collins et al. | 336/155 |
| 5,399,237 | 3/1995 | Keswick et al. | 216/68 |
| 5,401,350 | 3/1995 | Patrick et al. | 156/345 |
| 5,414,246 | 5/1995 | Shapona | 219/640 |
| 5,423,945 | 6/1995 | Marks et al. | 438/695 |
| 5,435,881 | 7/1995 | Ogle | 156/345 |
| 5,477,975 | 12/1995 | Rice et al. | 216/68 |
| 5,514,246 | 5/1996 | Blalock | 438/694 |
| 5,529,657 | 6/1996 | Ishii | 156/345 |
| 5,556,501 | 9/1996 | Collins et al. | 156/345 |
| 5,587,038 | 12/1996 | Cecchi et al. | 156/345 |
| 5,637,961 | 6/1997 | Ishii et al. | 315/111.51 |
| 5,683,548 | 11/1997 | Hartig et al. | 156/345 |
| 5,753,044 | 5/1998 | Hanawa et al. | 118/723 I |
| 5,938,883 | 8/1999 | Ishii et al. | 156/345 |
| 5,944,942 | 8/1999 | Ogle | 156/345 |

FOREIGN PATENT DOCUMENTS

| | | |
|---|---|---|
| 0 727 807 A1 | 8/1996 | European Pat. Off. . |
| 0 742 577 | 11/1996 | European Pat. Off. . |
| 55-154582 | 12/1980 | Japan . |
| 57-155732 | 9/1982 | Japan . |
| 61-147531 | 12/1984 | Japan . |
| 61-91377 | 5/1986 | Japan . |
| 61-142744 | 6/1986 | Japan . |
| 62-12129 | 1/1987 | Japan . |
| 62-254428 | 11/1987 | Japan . |
| 63-9120 | 1/1988 | Japan . |
| WO-92/20833 | 11/1992 | WIPO . |

OTHER PUBLICATIONS

Patent Abstracts of Japan, vol. 096, No. 002, Feb. 29, 1996 & JP 07 288196 A (Tokyo Electron Ltd), Oct. 31, 1995.

Patent Abstracts of Japan, vol. 018, No .545 (E–1617), Oct. 18, 1994 & JP 06 196446 A (NEC Corp), Jul. 15, 1994.

Patent Abstracts of Japan, vol. 096, No. 005, May 31, 1996 (JP 08 017799 A (Plasma Syst: KK), Jan. 19, 1996.

Coburn, W.J. "Increasing the Etch Rate Ratio o$SiO_2$/Si in Fluorocarbon Plasma Etching", IBM Technical Disclosure, vol. 19, No. 10, Mar. 1977.

Matsuo, Seitaro. "Selective etching of $SiO_2$ relative to Si by plasma reactive sputter etching", J. Vac. Sc. Technology, vol. 17, No. 2, Mar.–Apr. 1980.

European Patent Office Communication pursuant to Article 96(2) and Rule 51(2) EPC for Application No. 94307307.2–2208, mailed Jan. 17, 1996.

Patent Abstracts of Japan, Publication No. 57045927 A, Mar. 16, 1982 (Fujitsu Ltd).

Patent Abstracts of Japan, Publication No. 62052714 A, Mar. 7, 1987 (Olympus Optical Co Ltd; Taogosei Chem Ind Co Ltd).

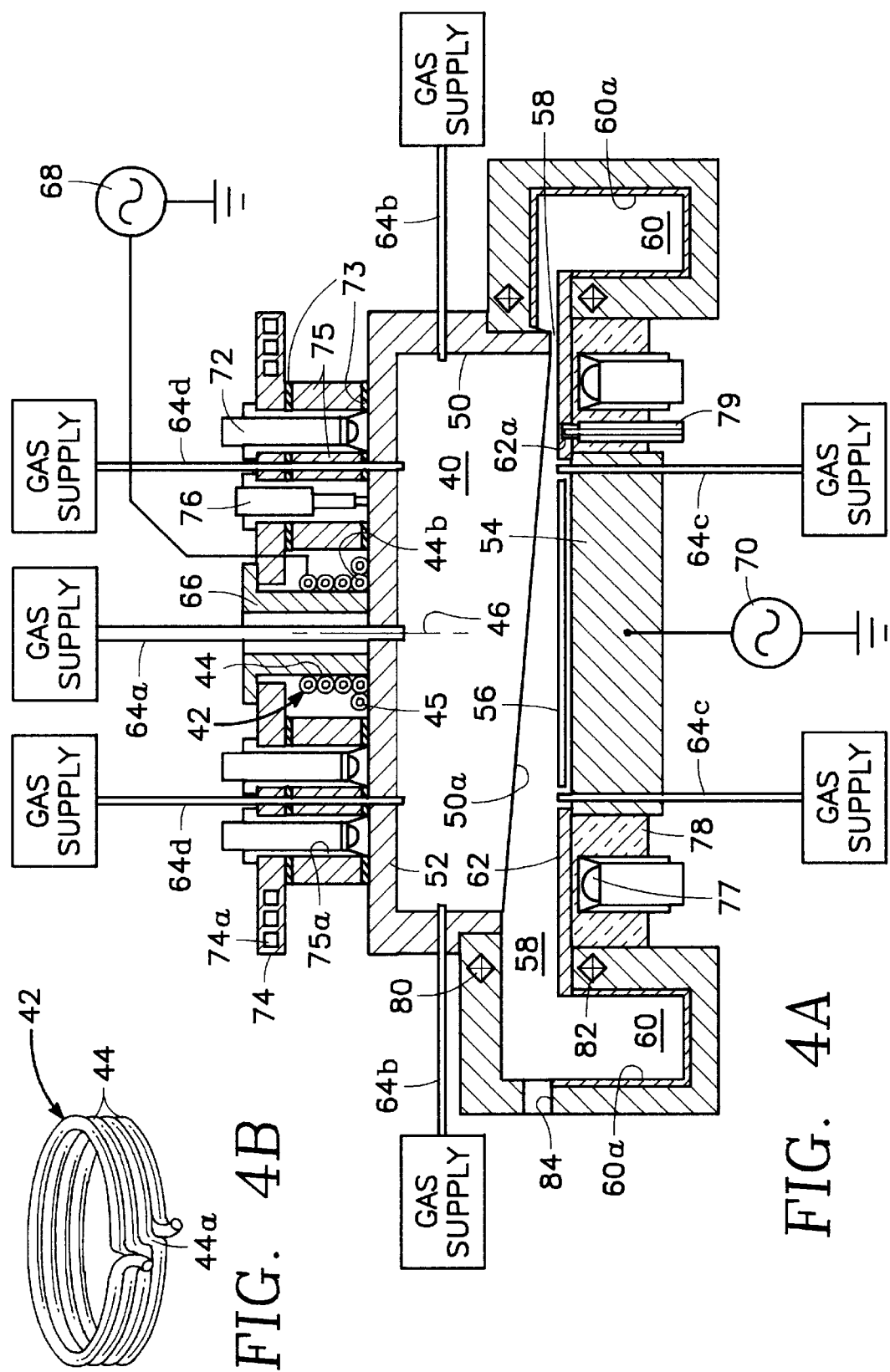

INDUCTIVELY COUPLED RF PLASMA REACTOR HAVING AN OVERHEAD SOLENOIDAL ANTENNA

BACKGROUND OF THE INVENTION

1. Related Applications

This application is a continuation-in-part of Ser. No. 08/580,026 filed Dec. 20, 1995 pending by Kenneth S. Collins et al. which is a continuation of. Ser. No. 08/041,796 filed Apr. 1, 1993 now U.S. Pat. No. 5,556,501 which is a continuation of Ser. No. 07/722,340 filed Jun. 27, 1991, now abandoned; and is a continuation-in-part of Ser. No. 08/503,467 filed Jul. 18, 1995 by Michael Rice et al. now U.S. Pat. No. 5,770,099 which is a divisional of Ser. No. 08/138,060 filed Oct. 15, 1993 now U.S. Pat. No. 5,477,975; and is a continuation-in-part of Ser. No. 08/597,577 filed Feb. 2, 1996 by Kenneth Collins now U.S. Pat. No. 6,077,384, which is a continuation-in-part of Ser. No. 08/521,668 filed Aug. 31, 1995 (now abandoned), which is a continuation-in-part of Ser. No. 08/289,336 filed Aug. 11, 1994 now abandoned, which is a continuation of Ser. No. 07/984,045 filed Dec. 1, 1992 (now abandoned). In addition, U.S. application Ser. No. 08/648,256 filed May 13, 1996 now U.S. Pat. No. 6,036,877 by Kenneth S. Collins et al. entitled "Plasma Reactor With Heated Source of a Polymer-Hardening Precursor Material" discloses related subject matter.

2. Technical Field

The invention is related to inductively coupled RF plasma reactors of the type having a reactor chamber ceiling overlying a workpiece being processed and an inductive coil antenna adjacent the ceiling.

3. Background Art

Inductively coupled RF plasma reactors are employed to perform a variety of processes on workpieces such as semiconductor wafers. Referring to FIG. 1, one type of inductively coupled RF plasma reactor has a reactor chamber 10 including a ceiling 12 and a cylindrical side wall 14. A pedestal 16 supports the workpiece 18, such as a semiconductor wafer, so that the workpiece generally lies in a workpiece support plane, and a bias RF power generator is coupled to the pedestal 16. A generally planar coil antenna 20 overlies the ceiling 12 and is coupled to a plasma source RF power generator 22. A chief advantage of inductively coupled RF plasma reactors over other types such as capacitively coupled ones, is that a higher ion density can be achieved with the inductively coupled type.

Adequate etch selectivity is achieved by operating at higher chamber pressure. (The term etch selectivity refers to the ratio of etch rates of two different materials exposed to etching in the reactor.) This is because the polymerization processes typically employed in a high density plasma etch reactor to protect underlying non-oxygen-containing (e.g., silicon, polysilicon or photoresist) layers during etching of an overlying oxygen-containing (e.g., silicon dioxide) layer are more efficient at higher chamber pressures (e.g., above about 20–500 mT) than at lower pressures. Polymer precursor gases (e.g., fluorocarbon or fluorohydrocarbon gases) in the chamber tend to polymerize strongly on non-oxygen-containing surfaces (such as silicon or photoresist), particularly at higher chamber pressures, and only weakly on oxygen-containing surfaces (such as silicon dioxide), so that the non-oxygen-containing surfaces are relatively well-protected from etching while oxygen-containing surfaces (such as silicon dioxide) are relatively unprotected and are etched. Such a polymerization process enhances the oxide-to-silicon etch selectivity better at higher chamber pressures because the polymerization rate is higher at higher pressures such as 100 mT. Therefore, it is desireable to operate at a relatively high chamber pressure when plasma-etching oxygen-containing layers over non-oxygen-containing layers. For example, under certain operating conditions such as a chamber pressure of 5 mT, an oxide-to-photoresist etch selectivity of less than 3:1 was obtained, and raising the pressure to the 50–100 mT range increased the selectivity to over 6:1. The oxide-to-polysilicon etch selectivity exhibited a similar behavior.

The problem with increasing the chamber pressure (in order to increase etch selectivity) is that plasma ion spatial density distribution across the wafer surface becomes less uniform. There are two reasons this occurs: (1) the electron mean free path in the plasma decreases with pressure; and (2) the inductive field skin depth in the plasma increases with pressure. How these two factors affect plasma ion spatial density distribution will now be explained.

With regard to item 1 above, the electron-to-neutral species elastic collision mean free path length, which is inversely proportional to chamber pressure, determines the extent to which electrons can avoid recombination with other gas particles and diffuse through the plasma to produce a more uniform electron and ion distribution in the chamber. Typically, electrons are not generated uniformly throughout the chamber (due, for example, to a non-uniform inductive antenna pattern) and electron diffusion through the plasma compensates for this and provides greater electron and plasma ion spatial density distribution uniformity. (Electron spatial density distribution across the wafer surface directly affects plasma ion spatial density distribution because plasma ions are produced by collisions of process gas particles with energetic electrons.) Increasing chamber pressure suppresses electron diffusion in the plasma, thereby reducing (degrading) plasma ion spatial density distribution uniformity.

This problem may be understood by reference to FIG. 1, in which the inductive antenna 20, due to its circular symmetry, has an antenna pattern (i.e., a spatial distribution of the magnitude of the induced electric field) with a null or local minimum along the antenna axis of symmetry so that very few if any electrons are produced over the wafer center. At low chamber pressures, electron diffusion into the space ("gap") between the antenna 20 and the workpiece 18 is sufficient to transport electrons into the region near the wafer center despite the lack of electron production in that region, thereby providing a more uniform plasma distribution at the wafer surface. With increasing pressure, electron diffusion decreases and so plasma ion distribution becomes less uniform.

A related problem is that the overall plasma density is greater near the ceiling 12 (where the density of hot electrons is greatest) than at the workpiece 18, and falls off more rapidly away from the ceiling 12 as chamber pressure is increased. For example, the electron mean free path in an argon plasma with a mean electron temperature of 5 eV at a chamber pressure of 1 mT is on the order of 10 cm, at 10 mT it is 1.0 cm and at 100 mT it is 0.1 cm. Thus in a typical application, for a 5 cm ceiling-to-workpiece gap, most of the electrons generated near the ceiling 12 reach the workpiece at a chamber pressure of 1 mT (for a maximum ion density at the workpiece), and a significant number at 10 mT, while at 100 mT few do (for a minimal ion density at the workpiece). Accordingly, it may be said that a high pressure regime is one in which the mean free path length is about $\frac{1}{10}$ or more of the ceiling-to-workpiece gap. One way of increasing the overall plasma ion density at the workpiece 18 (in order to increase etch rate and reactor throughput) without decreasing the chamber pressure is to narrow the gap so that the mean free path length becomes a greater fraction of the gap. However, this exacerbates other problems created by increasing chamber pressure, as will be described further below.

With regard to item (2) above, the inductive field skin depth corresponds to the depth through the plasma—measured downward from the ceiling 12—within which the inductive field of the antenna 20 is nearly completely absorbed. FIG. 2 illustrates how skin depth in an argon plasma increases with chamber pressure above a threshold pressure of about 0.003 mT (below which the skin depth is virtually constant over pressure). FIG. 2 also illustrates in the dashed-line curve how electron-to-neutral elastic collision mean free path length decreases linearly with increasing pressure. The skin depth function graphed in FIG. 2 assumes a source frequency of 2 MHz and an argon plasma density of $5\text{--}10^{17}$ electrons/m$^3$. (It should be noted that the corresponding plasma density for an electro-negative gas is less, so that the curve of FIG. 2 would be shifted upward with the introduction of an electro-negative gas.) The graph of FIG. 2 was derived using a collision cross-section for an electron temperature of 5 eV in argon. (It should be noted that with a molecular gas such as $C_2F_6$ instead of argon, the collision cross-section is greater so that the skin depth is greater at a given pressure and the entire curve of FIG. 2 is shifted upward.) If the chamber pressure is such that the inductive field is absorbed within a small fraction—e.g., 1/10th—of the ceiling-to-workpiece gap adjacent the ceiling 12 (corresponding to a pressure of 1 mT for a 5 cm gap in the example of FIG. 2), then electron diffusion—throughout the remaining 9/10ths of the gap—produces a more uniform plasma ion distribution at the workpiece surface. However, as pressure increases and skin depth increases—e.g., beyond about 1/10th of the gap, then electron diffusion tends to have less effect. Thus, a measure of a high skin depth regime is that in which the skin depth is at about 1/10 or more of the source-to-workpiece gap length. For example, if the pressure is so great that skin depth equals the ceiling-to-workpiece spacing (corresponding to a pressure of about 100 mT for a 5 cm gap in the example of FIG. 2), then any antenna pattern null or local minimum extends to the surface of the workpiece 18, effectively preventing electron diffusion from compensating for the effects of the antenna pattern null on the processing of the workpiece. Such problems can arise, for example, when the ceiling-to-workpiece spacing is decreased in order to increase overall plasma density at the workpiece surface. A related problem with a small ceiling-to-workpiece spacing and a high chamber pressure is that electrons are lost not only to recombination with particles in the processing gas but are also lost to recombination by collisions with the surface of the ceiling 12 and the workpiece 18, so that it is even more difficult for electrons generated in other regions to diffuse into the region adjacent the workpiece center.

In summary, plasma ion density at the wafer can be enhanced by reducing the gap between the axially symmetrical antenna/ceiling 20, 12 and the workpiece 18. But if the gap is reduced so much that the inductive field skin depth becomes a substantial fraction ($\geq 10\%$) of the gap, then ion density at the workpiece center falls off significantly relative to the edge due to the antenna pattern's center null. However, for a smaller fraction of skin depth over gap and sufficient electron diffusion (characteristic of a low chamber pressure), electrons produced far from the workpiece center may diffuse into the center region before being lost to gas phase recombination or surface recombination, thereby compensating for the antenna pattern's center null. But as the gap is reduced (to increase overall plasma density at the workpiece) and chamber pressure is increased (to enhance etch selectivity), then: (1) the induced electric field over the workpiece center approaches a null so that no electrons are produced in that region, and (2) electrons produced in other regions generally cannot diffuse to the workpiece center region due to recombination with gas particles and chamber (e.g., ceiling) surfaces.

Thus, as the wafer-to-coil distance is decreased by the reactor designer (in order to enhance plasma density near the wafer surface, for example), the plasma ion density decreases at the wafer center and ultimately, at very short wafer-to-antenna distances, becomes a center null giving rise to an unacceptable process non-uniformity. For example, in a plasma etch process carried out in such a reactor, the etch rate at the wafer center may be so much less than elsewhere that it becomes impossible to perform a complete etch across the entire wafer surface without over-etching near the wafer periphery. Conversely, it becomes impossible to avoid over-etching at the wafer periphery without under-etching the wafer center. Thus, the problem is to find a way to decrease the wafer-to-antenna distance without incurring a concomitant penalty in process non-uniformity.

One approach for solving or at least ameliorating this problem is disclosed in U.S. application Ser. No. 08/507,726 filed Jul. 26, 1995 by Kenneth S. Collins et al. and entitled "Plasma Source with an Electronically Variable Density Profile", which discloses that an outer generally planar coil antenna 24 coupled to a second independently controlled plasma source RF power generator 26 can be provided over the ceiling 12 concentric with the inner coil antenna 20 of FIG. 1. The efficacy of this solution can be seen from the graphs of FIGS. 3A through 3E. FIG. 3A illustrates the plasma ion density as a function of radius from the center of the workpiece 18 for a workpiece-to-ceiling height of 4 inches (10 cm), the curve labelled A being the ion density produced by the outer coil antenna 24 and the curve labelled B being the ion density produced by the inner coil antenna 20. The total resulting plasma ion density is the sum of these two curves but is not depicted in the drawing for the sake of simplicity. FIG. 3A shows that at a height of 4 inches (10 cm), the outer coil antenna 24 produces a uniform plasma ion density distribution, the inner coil antenna 20 not being required. FIG. 3B corresponds to FIG. 3A for a reduced workpiece-to-ceiling height of 3 inches (7.5 cm), and shows that a dip in plasma ion density produced by the outer coil antenna 24 is compensated by the center-dominated ion density produced by the inner coil antenna 20. FIG. 3C corresponds to FIG. 3A for a further reduced workpiece-to-ceiling height of 2.5 inches (6.25 cm), and shows that the compensation by the inner coil 20 for the center dip in the plasma ion density produced by the outer coil 24 remains fairly effective as the workpiece-to-ceiling height is further reduced, although a slight dip in the total resulting plasma ion density near the center would begin to appear below this height. As shown in FIG. 3D, a further reduction in workpiece-to-ceiling height to only 1.25 inches (about 3.2 cm) yields a pronounced dip in the plasma ion densities produced by both the inner and outer coil antennas 20, 24, so that there is very little compensation and the resulting plasma ion density (the sum of the two curves shown) is highly non-uniform. As shown in FIG. 3E, the problem worsens as the height is further reduced to 0.8 inches (2 cm).

What FIGS. 3A–3E show is that even the use of inner and outer coil antennas to solve the problem of the null in plasma ion density near the workpiece center may lose effectiveness as the workpiece-to-ceiling height is reduced below certain values. Thus, the wafer-to-ceiling height cannot be reduced below a factor of the skin depth without sacrificing process uniformity. On the other hand, unless the wafer-to-ceiling height can be so reduced, plasma density and process performance is limited. Accordingly, there is a need for a way to reduce the workpiece-to-ceiling height without sacrificing process uniformity.

SUMMARY OF THE INVENTION

The invention is embodied in an inductively coupled RF plasma reactor including a reactor chamber enclosure defining a plasma reactor chamber and a support for holding a workpiece inside the chamber, a non-planar inductive antenna adjacent the reactor chamber enclosure, the non-planar inductive antenna including inductive elements spatially distributed in a non-planar manner relative to a plane of the workpiece, and a plasma source RF power supply coupled to the non-planar inductive antenna. Alternatively, the non-planar distribution of the antenna's inductive elements is such that the inductive elements are spatially distributed approximately in respective planes intersecting the axis of symmetry. Although the inductive antenna may be either asymmetrical or symmetrical, the inductive antenna preferably includes a symmetrical solenoid winding such as a vertical stack of inductive windings. Generally, the invention provides a means for adjusting such processing parameters as plasma ion density distribution across the surface of the workpiece. More specifically, the invention compensates for a null in an RF inductive pattern of the antenna, which is typically near an axis of symmetry of the antenna. In order to accomplish this, in a preferred embodiment the windings are at a minimum radial distance from the axis of symmetry of the antenna so as to concentrate the induction field over the workpiece center for optimum process uniformity at small workpiece-to-antenna distances.

In an alternative embodiment, the windings are at a radial distance from the axis of symmetry which is a substantial fraction of a radius of the chamber. This radial distance is selected to be an optimum value which provides the greatest uniformity in plasma ion density under particular conditions which may include sources of process non-uniformities in addition to the antenna pattern center null. The determination of the optimum radial distance can be carried out by the skilled worker by trial and error steps of placing the solenoid winding at different radial locations and employing conventional techniques to determine the radial profile of the plasma ion density at each step.

For more versatility, the reactor may further include a second inductive antenna adjacent the reactor enclosure at an outer radial location relative to the solenoid winding and, preferably, a second plasma source RF power supply coupled to the second inductive antenna for independent adjustment of RF power applied to the inner and outer antennas. In one embodiment, the second inductive antenna is a second non-planar inductive antenna. In another embodiment, the second non-planar inductive antenna is a solenoid winding.

The reactor solenoid winding may be a doubly wound solenoid winding, which may consist of either a pair of concentric single solenoid windings or a vertical stack of pairs of windings. Likewise, if there is a second radially outward solenoid winding, then the second solenoid winding may be a doubly wound solenoid winding.

The vertical stack of conductive windings may have a right cylindrical shape, an upright conical shape or an inverted conical shape or a non-symmetrical shape. In order to distribute a selected portion of the induction field away from the center, a planar coil conductor may extend radially outwardly from a bottom winding of the vertical stack of conductive windings.

The invention is not confined to any particular non-planar configuration or shape, and any suitable shape can be employed which performs the function of providing the requisite concentration of the RF induction field near the center axis to compensate for the antenna pattern center null.

BRIEF DESCRIPTION OF THE DRAWINGS

FIG. 4A is a cut-away side view of a plasma reactor in accordance with an alternative embodiment of the invention employing a single three-dimensional center non-planar solenoid winding.

FIG. 4B is an enlarged view of a portion of the reactor of FIG. 4A illustrating a preferred way of winding the solenoidal winding.

DETAILED DESCRIPTION OF THE PREFERRED EMBODIMENTS

Figure 1:
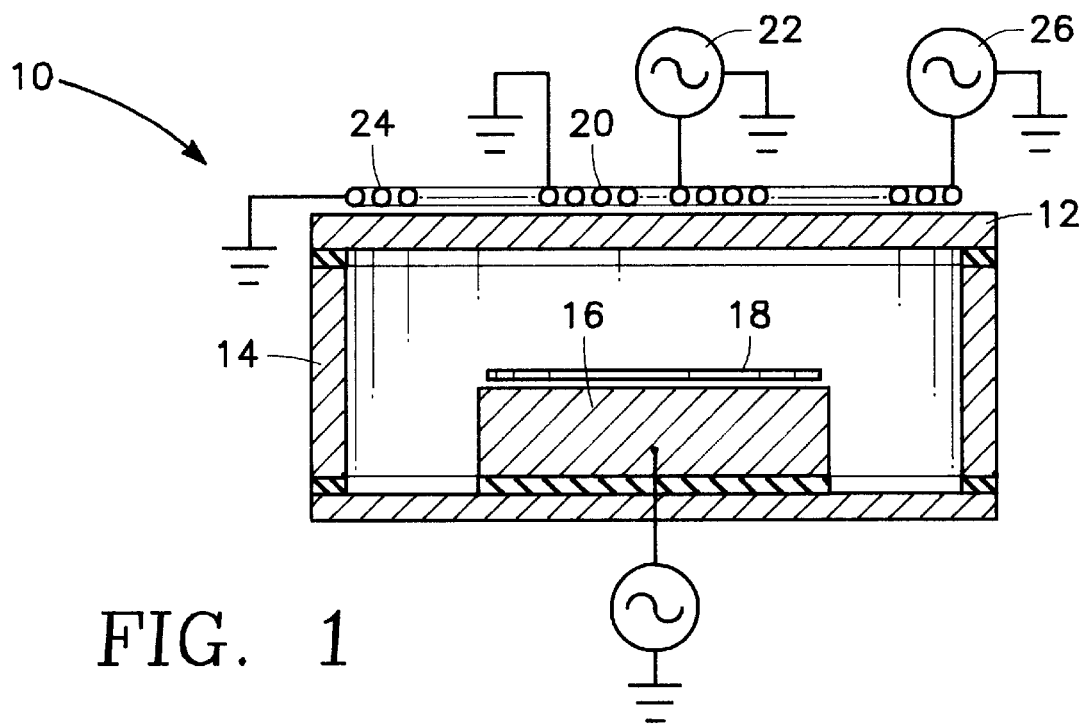
FIG. 1 is a cut-away side view of an inductively coupled plasma reactor of the type employed in a co-pending U.S. patent application referred to above employing generally planar coil antennas.
Figure 2:
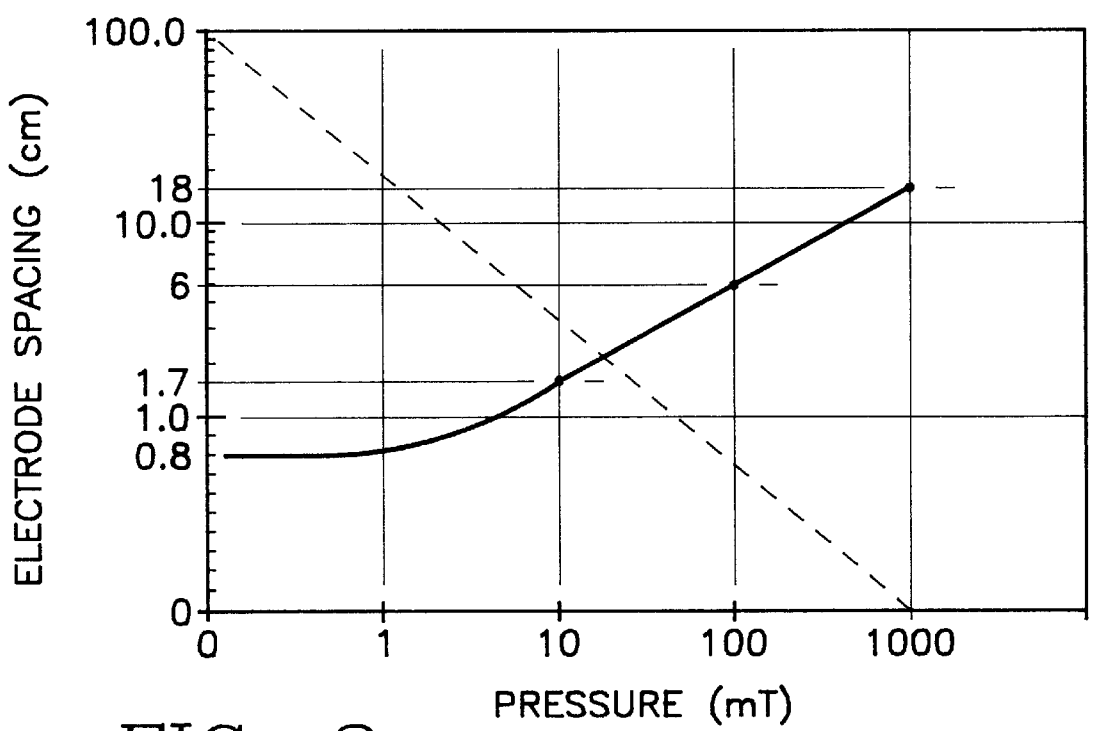
FIG. 2 is a log-log scale graph of induction field skin depth in a plasma in cm (solid line) and of electron-to-neutral elastic collision mean free path length (dashed line) as functions of pressure in torr (horizontal axis).

In a plasma reactor having a small antenna-to-workpiece gap, in order to minimize the decrease in plasma ion density near the center region of the workpiece corresponding to the inductive antenna pattern center null, it is an object of the invention to increase the magnitude of the induced electric field at the center region. The invention accomplishes this by concentrating the turns of an inductive coil overlying the ceiling near the axis of symmetry of the antenna and maximizing the rate of change (at the RF source frequency) of magnetic flux linkage between the antenna and the plasma in that center region.

In accordance with the invention, a solenoidal coil around the symmetry axis simultaneously concentrates its inductive coil turns near the axis and maximizes the rate of change of magnetic flux linkage between the antenna and the plasma in the center region adjacent the workpiece. This is because the number of turns is large and the coil radius is small, as required for strong flux linkage and close mutual coupling to the plasma in the center region. (In contrast, a conventional planar coil antenna spreads its inductive field over a wide radial area, pushing the radial power distribution outward toward the periphery.) As understood in this specification, a solenoid-like antenna is one which has plural inductive elements distributed in a non-planar manner relative to a plane of the workpiece or workpiece support surface or overlying chamber ceiling, or spaced at different distances transversely to the workpiece support plane (defined by a workpiece supporting pedestal within the chamber) or spaced at different distances transversely to an overlying chamber ceiling. As understood in this specification, an inductive element is a current-carrying element mutually coupled with the plasma in the chamber and/or with other inductive elements of the antenna.

A preferred embodiment of the invention includes dual solenoidal coil antennas with one solenoid near the center and another one at an outer peripheral radius. The two solenoids may be driven at different RF frequencies or at the same frequency, in which case they are preferably phase-locked and more preferably phase-locked in such a manner that their fields constructively interact. The greatest practical displacement between the inner and outer solenoid is preferred because it provides the most versatile control of etch rate at the workpiece center relative to etch rate at the workpiece periphery. The skilled worker may readily vary RF power, chamber pressure and electro-negativity of the process gas mixture (by choosing the appropriate ratio of molecular and inert gases) to obtain a wider range or process window in which to optimize (using the present invention) the radial uniformity of the etch rate across the workpiece. Maximum spacing between the separate inner and outer solenoids of the preferred embodiment provides the following advantages:

(1) maximum uniformity control and adjustment;
(2) maximum isolation between the inner and outer solenoids, preventing interference of the field from one solenoid with that of the other; and
(3) maximum space on the ceiling (between the inner and outer solenoids) for temperature control elements to optimize ceiling temperature control.

Figure 3A:
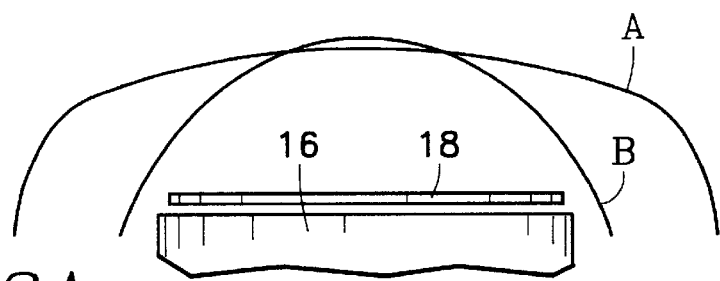
FIG. 3A is a graph of plasma ion density as a function of radial position relative to the workpiece center in the reactor of FIG. 1 for a workpiece-to-ceiling height of 4 inches, the curves labelled A and B corresponding to plasma ion densities produced by outer and inner coil antennas respectively.
Figure 3B:
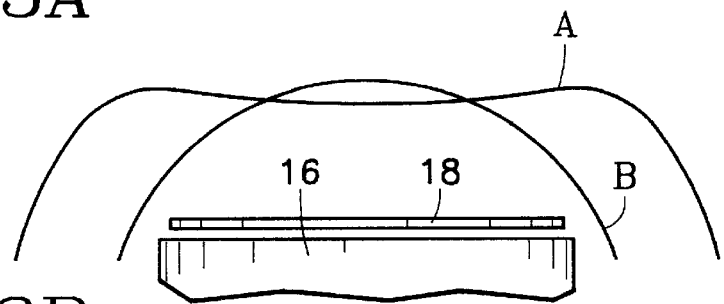
FIG. 3B is a graph of plasma ion density as a function of radial position relative to the workpiece center in the reactor of FIG. 1 for a workpiece-to-ceiling height of 3 inches, the curves labelled A and B corresponding to plasma ion densities produced by outer and inner coil antennas respectively.
Figure 3C:
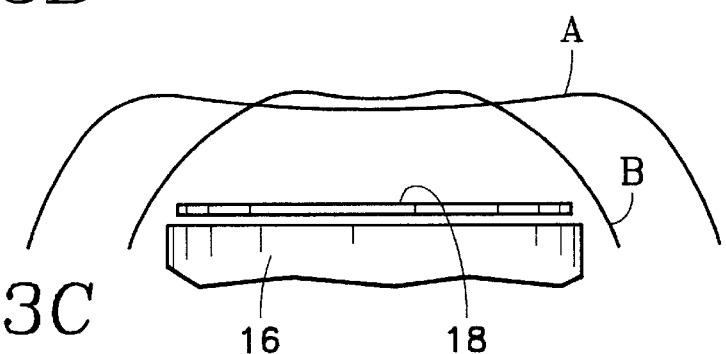
FIG. 3C is a graph of plasma ion density as a function of radial position relative to the workpiece center in the reactor of FIG. 1 for a workpiece-to-ceiling height of 2.5 inches, the curves labelled A and B corresponding to plasma ion densities produced by outer and inner coil antennas respectively.
Figure 3D:
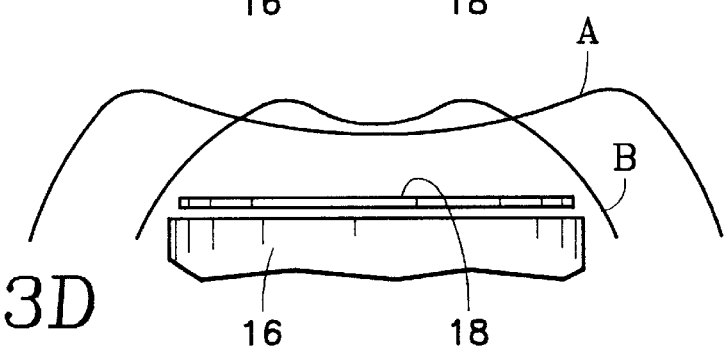
FIG. 3D is a graph of plasma ion density as a function of radial position relative to the workpiece center in the reactor of FIG. 1 for a workpiece-to-ceiling height of 1.25 inches, the curves labelled A and B corresponding to plasma ion densities produced by outer and inner coil antennas respectively.
Figure 3E:
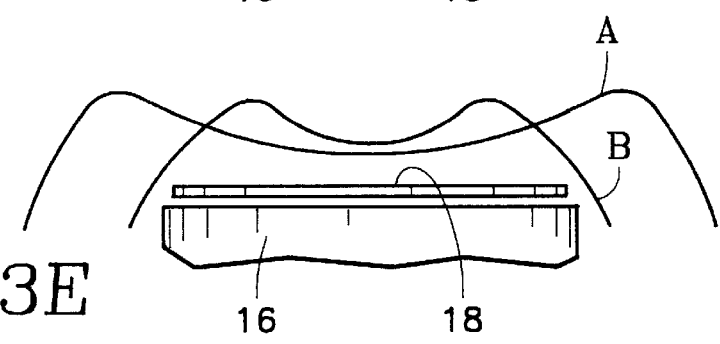
FIG. 3E is a graph of plasma ion density as a function of radial position relative to the workpiece center in the reactor of FIG. 1 for a workpiece-to-ceiling height of 0.8 inches, the curves labelled A and B corresponding to plasma ion densities produced by outer and inner coil antennas respectively.
Figure 4C:
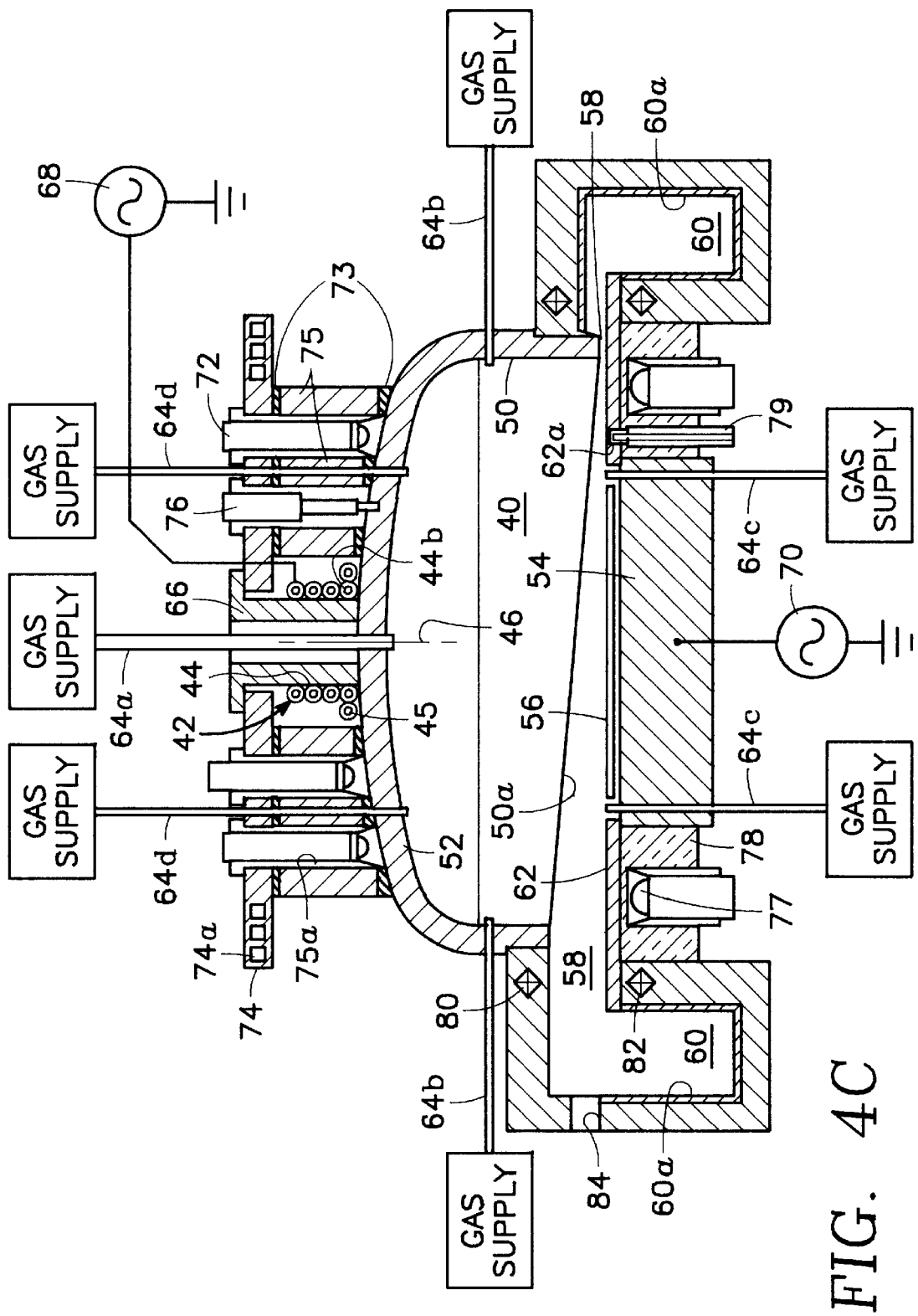
FIG. 4C is a cut-away side view of a plasma reactor corresponding to FIG. 4A but having a dome-shaped ceiling.
Figure 5:
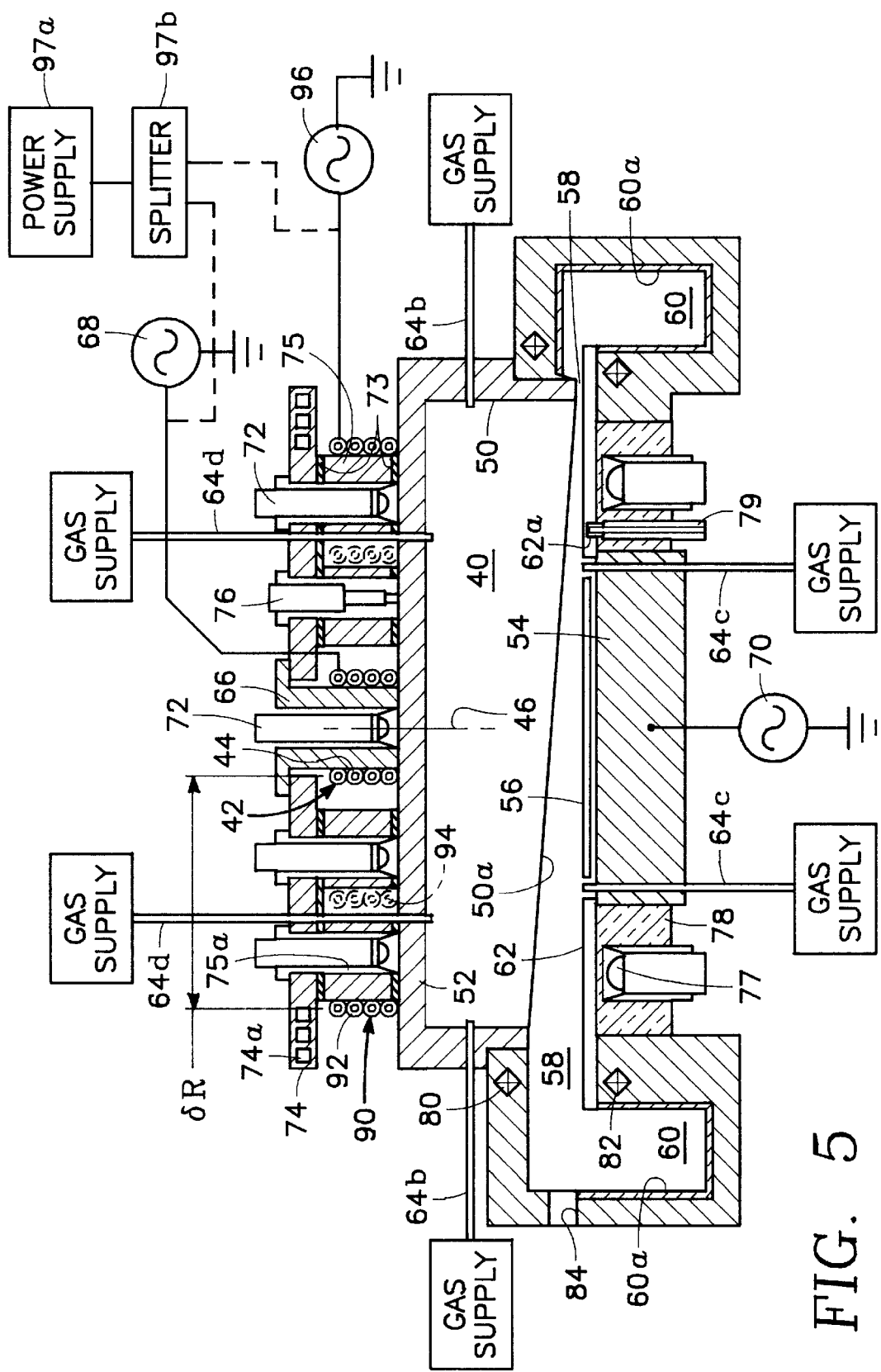
FIG. 5 is a cut-away side view of a plasma reactor in accordance with the preferred embodiment of the invention employing inner and outer vertical solenoid windings.

FIG. 4A illustrates a single solenoid embodiment (not the preferred embodiment) of an inductively coupled RF plasma reactor having a short workpiece-to-ceiling gap, meaning that the skin depth of the induction field is on the order of the gap length. As understood in this specification, a skin depth which is on the order of the gap length is that which is within a factor of ten of (i.e., between about one tenth and about ten times) the gap length. FIG. 5 illustrates a dual solenoid embodiment of an inductively coupled RF plasma reactor, and is the preferred embodiment of the invention. Except for the dual solenoid feature, the reactor structure of the embodiments of FIGS. 4A and 5 is nearly the same, and will now be described with reference to FIG. 4A. The reactor includes a cylindrical chamber 40 similar to that of FIG. 1, except that the reactor of FIG. 4A has a non-planar coil antenna 42 whose windings 44 are closely concentrated in non-planar fashion near the antenna symmetry axis 46. While in the illustrated embodiment the windings 44 are symmetrical and their symmetry axis 46 coincides with the center axis of the chamber, the invention may be carried out differently. For example, the windings may not be symmetrical and/or their axis of symmetry may not coincide. However, in the case of a symmetrical antenna, the antenna has a radiation pattern null near its symmetry axis 46 coinciding with the center of the chamber or the workpiece center. Close concentration of the windings 44 about the center axis 46 compensates for this null and is accomplished by vertically stacking the windings 44 in the manner of a solenoid so that they are each a minimum distance from the chamber center axis 46. This increases the product of current (I) and coil turns (N) near the chamber center axis 46 where the plasma ion density has been the weakest for short workpiece-to-ceiling heights, as discussed above with reference to FIGS. 3D and 3E. As a result, the RF power applied to the non-planar coil antenna 42 produces greater induction [d/dt][N●I] at the wafer center—at the antenna symmetry axis 46—(relative to the peripheral regions) and therefore produces greater plasma ion density in that region, so that the resulting plasma ion density is more nearly uniform despite the small workpiece-to-ceiling height. Thus, the invention provides a way for reducing the ceiling height for enhanced plasma process performance without sacrificing process uniformity.

The drawing of FIG. 4B best shows a preferred implementation of the windings employed in the embodiments of FIGS. 4A and 5. In order that the windings 44 be at least nearly parallel to the plane of the workpiece 56, they preferably are not wound in the usual manner of a helix but, instead, are preferably wound so that each individual turn is parallel to the (horizontal) plane of the workpiece 56 except at a step or transition 44a between turns (from one horizontal plane to the next).

Figure 4D:
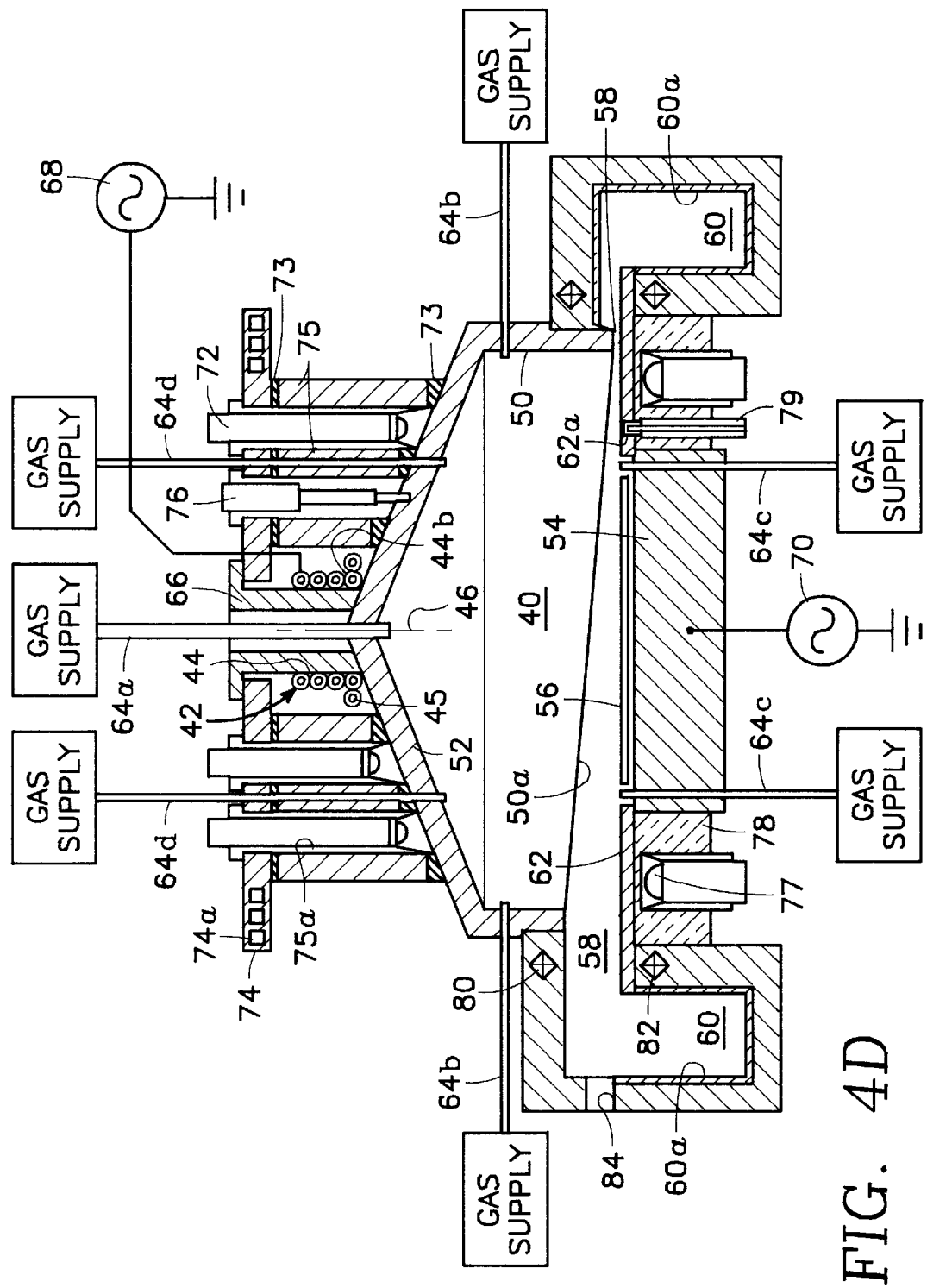
FIG. 4D is a cut-away side view of a plasma reactor corresponding to FIG. 4A but having a conical ceiling.
Figure 4E:
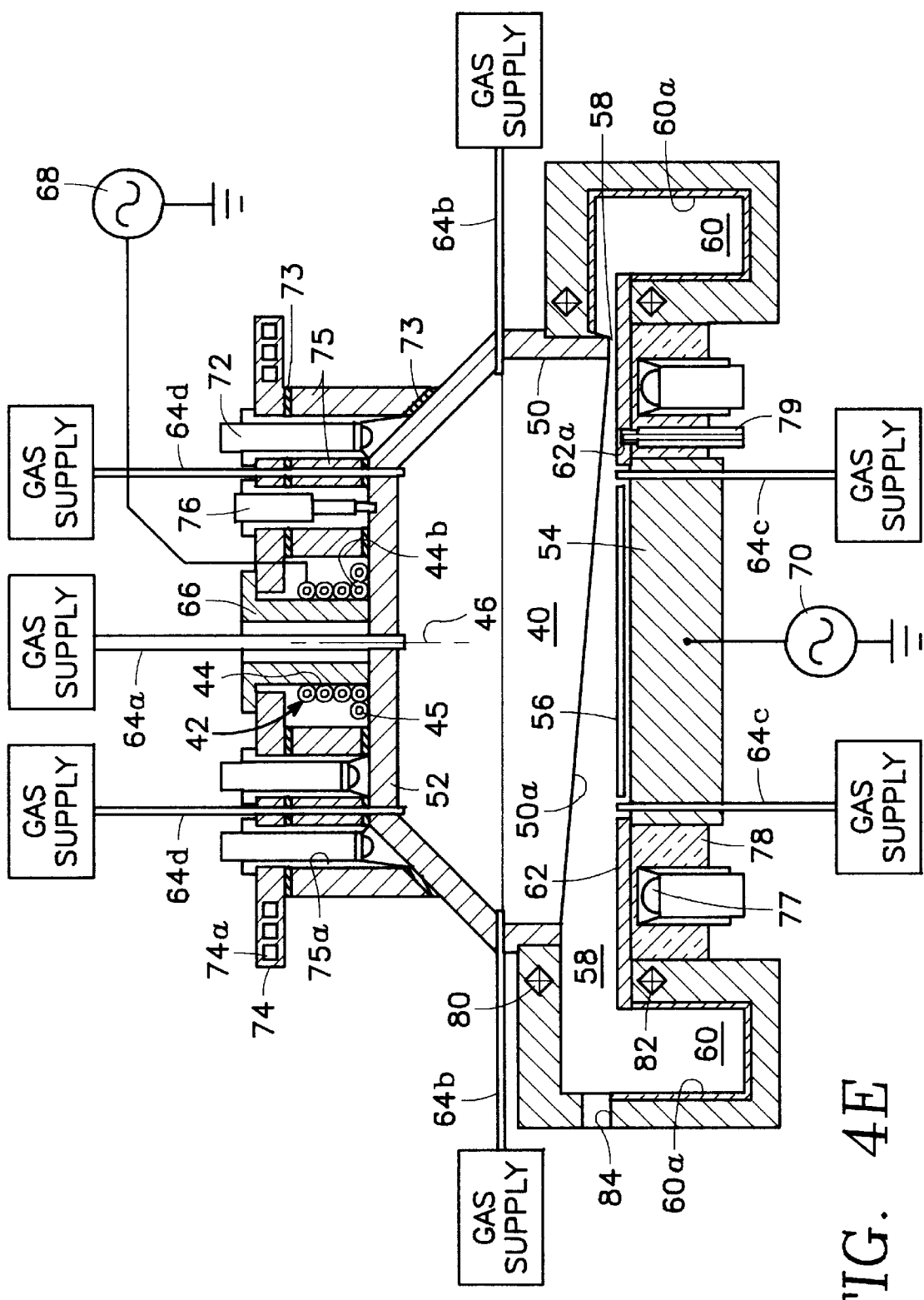
FIG. 4E is a cut-away side view of a plasma reactor corresponding to FIG. 4D but having a truncated conical ceiling.

The cylindrical chamber 40 consists of a cylindrical side wall 50 and a circular ceiling 52 integrally formed with the side wall 50 so that the side wall 50 and ceiling 52 constitute a single piece of material, such as silicon. However, the invention may be carried out with the side wall 50 and ceiling 52 formed as separate pieces, as will be described later in this specification. The circular ceiling 52 may be of any suitable cross-sectional shape such as planar (FIG. 4A), dome (FIG. 4C), conical (FIG. 4D), truncated conical (FIG. 4E), cylindrical or any combination of such shapes or curve of rotation. Such a combination will be discussed later in this specification. Generally, the vertical pitch of the solenoid 42 (i.e., its vertical height divided by its horizontal width) exceeds the vertical pitch of the ceiling 52, even for ceilings defining 3-dimensional surfaces such as dome, conical, truncated conical and so forth. The purpose for this, at least in the preferred embodiment, is to concentrate the induction of the antenna near the antenna symmetry axis, as discussed previously in this specification. A solenoid having a pitch exceeding that of the ceiling 52 is referred to herein as a non-conformal solenoid, meaning that, in general, its shape does not conform with the shape of the ceiling, and more specifically that its vertical pitch exceeds the vertical pitch of the ceiling. A 2-dimensional or flat ceiling has a vertical pitch of zero, while a 3-dimensional ceiling has a non-zero vertical pitch.

A pedestal 54 at the bottom of the chamber 40 supports a planar workpiece 56 in a workpiece support plane during processing. The workpiece 56 is typically a semiconductor wafer and the workpiece support plane is generally the plane of the wafer or workpiece 56. The chamber 40 is evacuated by a pump (not shown in the drawing) through an annular passage 58 to a pumping annulus 60 surrounding the lower portion of the chamber 40. The interior of the pumping annulus may be lined with a replaceable metal liner 60a. The annular passage 58 is defined by the bottom edge 50a of the cylindrical side wall 50 and a planar ring 62 surrounding the pedestal 54. Process gas is furnished into the chamber 40 through any one or all of a variety of gas feeds. In order to control process gas flow near the workpiece center, a center gas feed 64a can extend downwardly through the center of the ceiling 52 toward the center of the workpiece 56 (or the center of the workpiece support plane). In order to control gas flow near the workpiece periphery (or near the periphery of the workpiece support plane), plural radial gas feeds 64b, which can be controlled independently of the center gas feed 64a, extend radially inwardly from the side wall 50 toward the workpiece periphery (or toward the workpiece support plane periphery), or base axial gas feeds 64c extend upwardly from near the pedestal 54 toward the workpiece periphery, or ceiling axial gas feeds 64d can extend downwardly from the ceiling 52 toward the workpiece periphery. Etch rates at the workpiece center and periphery can be adjusted independently relative to one another to achieve a more radially uniform etch rate distribution across the workpiece by controlling the process gas flow rates toward the workpiece center and periphery through, respectively, the center gas feed 64a and any one of the outer gas feeds 64b–d. This feature of the invention can be carried out with the center gas feed 64a and only one of the peripheral gas feeds 64b–d.

The solenoidal coil antenna 42 is wound around a housing 66 surrounding the center gas feed 64a. A plasma source RF power supply 68 is connected across the coil antenna 42 and a bias RF power supply 70 is connected to the pedestal 54.

Confinement of the overhead coil antenna 42 to the center region of the ceiling 52 leaves a large portion of the top surface of the ceiling 52 unoccupied and therefore available for direct contact with temperature control apparatus including, for example, plural radiant heaters 72 such as tungsten halogen lamps and a water-cooled cold plate 74 which may be formed of copper or aluminum for example, with coolant passages 74a extending therethrough. Preferably the coolant passages 74a contain a coolant of a known variety having a high thermal conductivity but a low electrical conductivity, to avoid electrically loading down the antenna or solenoid 42. The cold plate 74 provides constant cooling of the ceiling 52 while the maximum power of the radiant heaters 72 is selected so as to be able to overwhelm, if necessary, the cooling by the cold plate 74, facilitating responsive and stable temperature control of the ceiling 52. The large ceiling area irradiated by the heaters 72 provides greater uniformity and efficiency of temperature control. (It should be noted that radiant heating is not necessarily required in carrying out the invention, and the skilled worker may choose to employ an electric heating element instead, as will be described later in this specification.) If the ceiling 52 is silicon, as disclosed in co-pending U.S. application Ser. No. 08/597,577 filed Feb. 2, 1996 by Kenneth S. Collins et al., then there is a significant advantage to be gained by thus increasing the uniformity and efficiency of the temperature control across the ceiling. Specifically, where a polymer precursor and etchant precursor process gas (e.g., a fluorocarbon gas) is employed and where the etchant (e.g., fluorine) must be scavenged, the rate of polymer deposition across the entire ceiling 52 and/or the rate at which the ceiling 52 furnishes a fluorine etchant scavenger material (silicon) into the plasma is better controlled by increasing the contact area of the ceiling 52 with the temperature control heater 72. The solenoid antenna 42 increases the available contact area on the ceiling 52 because the solenoid windings 44 are concentrated at the center axis of the ceiling 52.

The increase in available area on the ceiling 52 for thermal contact is exploited in a preferred implementation by a highly thermally conductive torus 75 (formed of a ceramic such as aluminum nitride, aluminum oxide or silicon nitride or of a non-ceramic like silicon either lightly doped or undoped) whose bottom surface rests on the ceiling 52 and whose top surface supports the cold plate 74. One feature of the torus 75 is that it displaces the cold plate 74 well-above the top of the solenoid 42. This feature substantially mitigates or nearly eliminates the reduction in inductive coupling between the solenoid 42 and the plasma which would otherwise result from a close proximity of the conductive plane of the cold plate 74 to the solenoid 42. In order to prevent such a reduction in inductive coupling, it is preferable that the distance between the cold plate 74 and the top winding of the solenoid 42 be at least a substantial fraction (e.g., one half) of the total height of the solenoid 42. Plural axial holes 75a extending through the torus 75 are spaced along two concentric circles and hold the plural radiant heaters or lamps 72 and permit them to directly irradiate the ceiling 52. For greatest lamp efficiency, the hole interior surface may be lined with a reflective (e.g., aluminum) layer. The center gas feed 64a of FIG. 4A may be replaced by a radiant heater 72 (as shown in FIG. 5), depending upon the particular reactor design and process conditions. The ceiling temperature is sensed by a sensor such as a thermocouple 76 extending through one of the holes 75a not occupied by a lamp heater 72. For good thermal contact, a highly thermally conductive elastomer 73 such as silicone rubber impregnated with boron nitride is placed between the ceramic torus 75 and the copper cold plate 74 and between the ceramic torus 75 and the silicon ceiling 52.

As disclosed in the above-referenced co-pending application, the chamber 40 may be an all-semiconductor chamber, in which case the ceiling 52 and the side wall 50 are both a semiconductor material such as silicon. As described in the above-referenced co-pending application, controlling the temperature of, and RF bias power applied to, either the ceiling 52 or the wall 50 regulates the extent to which it furnishes fluorine scavenger precursor material (silicon) into the plasma or, alternatively, the extent to which it is coated with polymer. The material of the ceiling 52 is not limited to silicon but may be, in the alternative, silicon carbide, silicon dioxide (quartz), silicon nitride or a ceramic.

As described in the above-referenced co-pending application, the chamber wall or ceiling 50, 52 need not be used as the source of a fluorine scavenger material. Instead, a disposable silicon member can be placed inside the chamber 40 and maintained at a sufficiently high temperature to prevent polymer condensation thereon and permit silicon material to be removed therefrom into the plasma as fluorine scavenging material. In this case, the wall 50 and ceiling 52 need not necessarily be silicon, or if they are silicon they may be maintained at a temperature (and/or RF bias) near or below the polymer condensation temperature (and/or a polymer condensation RF bias threshold) so that they are coated with polymer from the plasma so as to be protected from being consumed. While the disposable silicon member may take any appropriate form, in the embodiment of FIG. 4A the disposable silicon member is an annular ring 62 surrounding the pedestal 54. Preferably, the annular ring 62 is high purity silicon and may be doped to alter its electrical or optical properties. In order to maintain the silicon ring 62 at a sufficient temperature to ensure its favorable participation in the plasma process (e.g., its contribution of silicon material into the plasma for fluorine scavenging), plural radiant (e.g., tungsten halogen lamp) heaters 77 arranged in a circle under the annular ring 62 heat the silicon ring 62 through a quartz window 78. As described in the above-referenced co-pending application, the heaters 77 are controlled in accordance with the measured temperature of the silicon ring 62 sensed by a temperature sensor 79 which may be a remote sensor such as an optical pyrometer or a fluoro-optical probe. The sensor 79 may extend partially into a very deep hole 62a in the ring 62, the deepness and narrowness of the hole tending at least partially to mask temperature-dependent variations in thermal emissivity of the silicon ring 62, so that it behaves more like a gray-body radiator for more reliable temperature measurement.

As described in U.S. application Ser. No. 08/597,577 referred to above, an advantage of an all-semiconductor chamber is that the plasma is free of contact with contaminant producing materials such as metal, for example. For this purpose, plasma confinement magnets 80, 82 adjacent the annular opening 58 prevent or reduce plasma flow into the pumping annulus 60. To the extent any polymer precursor and/or active species succeeds in entering the pumping annulus 60, any resulting polymer or contaminant deposits on the replaceable interior liner 60a may be prevented from re-entering the plasma chamber 40 by maintaining the liner 60a at a temperature significantly below the polymer condensation temperature, for example, as disclosed in the referenced co-pending application.

A wafer slit valve 84 through the exterior wall of the pumping annulus 60 accommodates wafer ingress and egress. The annular opening 58 between the chamber 40 and pumping annulus 60 is larger adjacent the wafer slit valve 84 and smallest on the opposite side by virtue of a slant of the bottom edge 50a of the cylindrical side wall 50 so as to make the chamber pressure distribution more symmetrical with a non-symmetrical pump port location.

Maximum inductance near the chamber center axis 46 is achieved by the vertically stacked solenoidal windings 44. In the embodiment of FIG. 4A, another winding 45 outside of the vertical stack of windings 44 but in the horizontal plane of the bottom solenoidal winding 44b may be added, provided the additional winding 45 is close to the bottom solenoidal winding 44b.

Referring specifically now to the preferred dual solenoid embodiment of FIG. 5, a second outer vertical stack or solenoid 90 of windings 92 at an outer location (i.e, against the outer circumferential surface of the thermally conductive torus 75) is displaced by a radial distance $\delta R$ from the inner vertical stack of solenoidal windings 44. Note that in FIG. 5 confinement of the inner solenoidal antenna 42 to the center and the outer solenoidal antenna 90 to the periphery leaves a large portion of the top surface of the ceiling 52 available for direct contact with the temperature control apparatus 72, 74, 75, as in FIG. 4A. An advantage is that the larger surface area contact between the ceiling 52 and the temperature control apparatus provides a more efficient and more uniform temperature control of the ceiling 52.

For a reactor in which the side wall 50 and ceiling 52 are formed of a single piece of silicon for example with an inside diameter of 12.6 in (32 cm), the wafer-to-ceiling gap is 3 in (7.5 cm), and the mean diameter of the inner solenoid was 3.75 in (9.3 cm) while the mean diameter of the outer solenoid was 11.75 in (29.3 cm) using 3/16 in diameter hollow copper tubing covered with a 0.03 thick teflon insulation layer, each solenoid consisting of four turns and being 1 in (2.54 cm) high. The outer stack or solenoid 90 is energized by a second independently controllable plasma source RF power supply 96. The purpose is to permit different user-selectable plasma source power levels to be applied at different radial locations relative to the workpiece or wafer 56 to permit compensation for known processing non-uniformities across the wafer surface, a significant advantage. In combination with the independently controllable center gas feed 64*a* and peripheral gas feeds 64*b–d*, etch performance at the workpiece center may be adjusted relative to etch performance at the edge by adjusting the RF power applied to the inner solenoid 42 relative to that applied to the outer solenoid 90 and adjusting the gas flow rate through the center gas feed 64*a* relative to the flow rate through the outer gas feeds 64*b–d*. While the present invention solves or at least ameliorates the problem of a center null or dip in the inductance field as described above, there may be other plasma processing non-uniformity problems, and these can be compensated in the versatile embodiment of FIG. 5 by adjusting the relative RF power levels applied to the inner and outer antennas 42, 90. For effecting this purpose with greater convenience, the respective RF power supplies 68, 96 for the inner and outer solenoids 42, 90 may be replaced by a common power supply 97*a* and a power splitter 97*b* which permits the user to change the relative apportionment of power between the inner and outer solenoids 42, 90 while preserving a fixed phase relationship between the fields of the inner and outer solenoids 42, 90. This is particularly important where the two solenoids 42, 90 receive RF power at the same frequency. Otherwise, if the two independent power supplies 68, 96 are employed, then they may be powered at different RF frequencies, in which case it is preferable to install RF filters at the output of each RF power supply 68, 96 to avoid off-frequency feedback from coupling between the two solenoids. In this case, the frequency difference should be sufficient to time-average out coupling between the two solenoids and, furthermore, should exceed the rejection bandwidth of the RF filters. Another option is to make each frequency independently resonantly matched to the respective solenoid, and each frequency may be varied to follow changes in the plasma impedance (thereby maintaining resonance) in lieu of conventional impedance matching techniques. In other words, the RF frequency applied to the antenna is made to follow the resonant frequency of the antenna as loaded by the impedance of the plasma in the chamber. In such implementations, the frequency ranges of the two solenoids should be mutually exclusive. Preferably, however, the two solenoids are driven at the same RF frequency and in this case it is preferable that the phase relationship between the two be such as to cause constructive interaction or superposition of the fields of the two solenoids. Generally, this requirement will be met by a zero phase angle between the signals applied to the two solenoids if they are both wound in the same sense. Otherwise, if they are oppositely wound, the phase angle is preferably 180°. In any case, coupling between the inner and outer solenoids can be minimized or eliminated by having a relatively large space between the inner and outer solenoids 42, 90, as will be discussed below in this specification.

The range attainable by such adjustments is increased by increasing the radius of the outer solenoid 90 to increase the spacing between the inner and outer solenoids 42, 90, so that the effects of the two solenoids 42, 90 are more confined to the workpiece center and edge, respectively. This permits a greater range of control in superimposing the effects of the two solenoids 42, 90. For example, the radius of the inner solenoid 42 should be no greater than about half the workpiece radius and preferably no more than about a third thereof. (The minimum radius of the inner solenoid 42 is affected in part by the diameter of the conductor forming the solenoid 42 and in part by the need to provide a finite non-zero circumference for an arcuate—e.g., circular—current path to produce inductance.) The radius of the outer coil 90 should be at least equal to the workpiece radius and preferably 1.5 or more times the workpiece radius. With such a configuration, the respective center and edge effects of the inner and outer solenoids 42, 90 are so pronounced that by increasing power to the inner solenoid the chamber pressure can be raised into the hundreds of mT while providing a uniform plasma, and by increasing power to the outer solenoid 90 the chamber pressure can be reduced to on the order of 0.01 mT while providing a uniform plasma. Another advantage of such a large radius of the outer solenoid 90 is that it minimizes coupling between the inner and outer solenoids 42, 90.

FIG. 5 indicates in dashed line that a third solenoid 94 may be added as an option, which is desireable for a very large chamber diameter.

Figure 6:
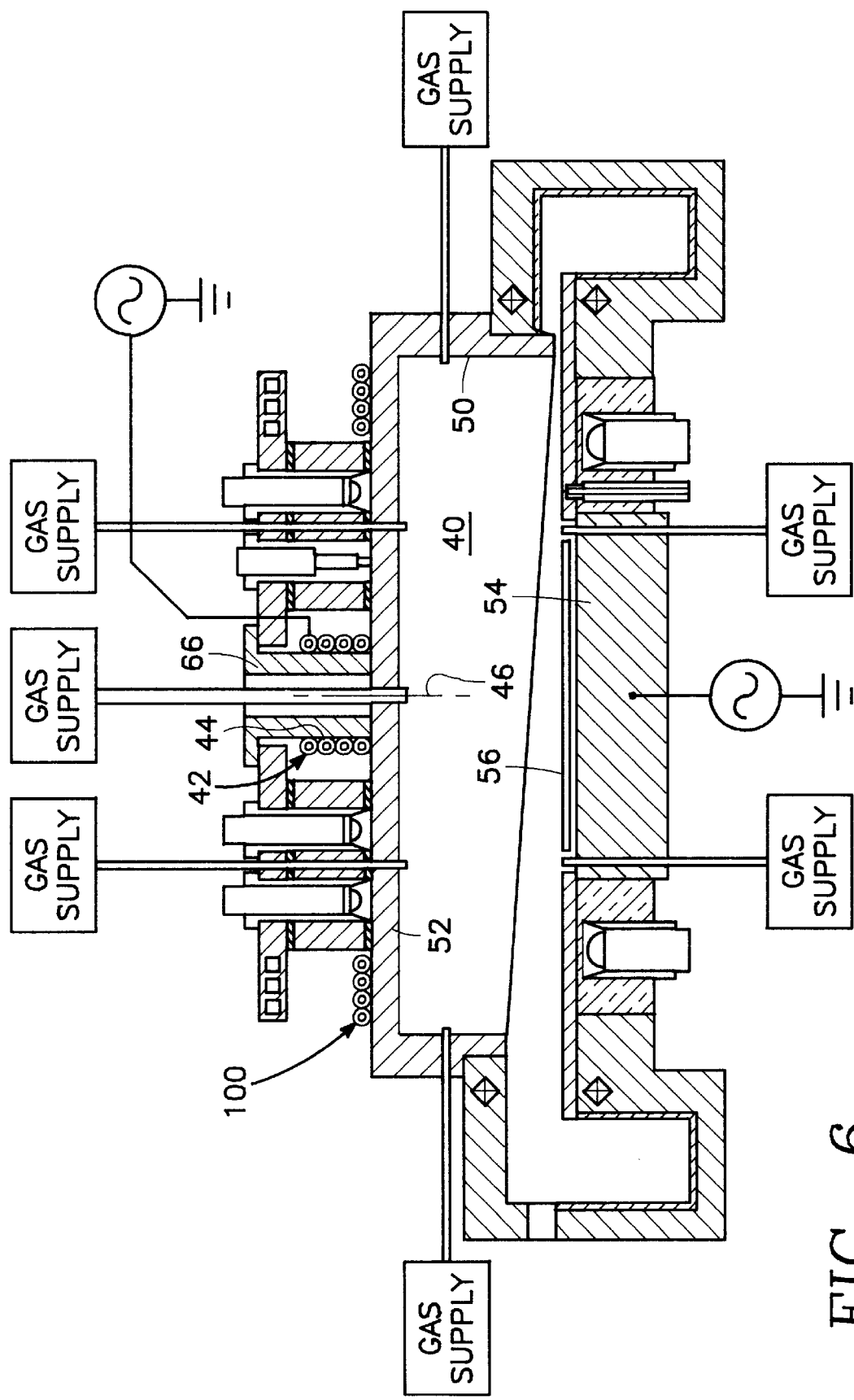
FIG. 6 is a cut-away side view of a plasma reactor in accordance with a second alternative embodiment of the invention corresponding to FIG. 5 in which the outer winding is flat.

FIG. 6 illustrates a variation of the embodiment of FIG. 5 in which the outer solenoid 90 is replaced by a planar winding 100.

Figure 7:
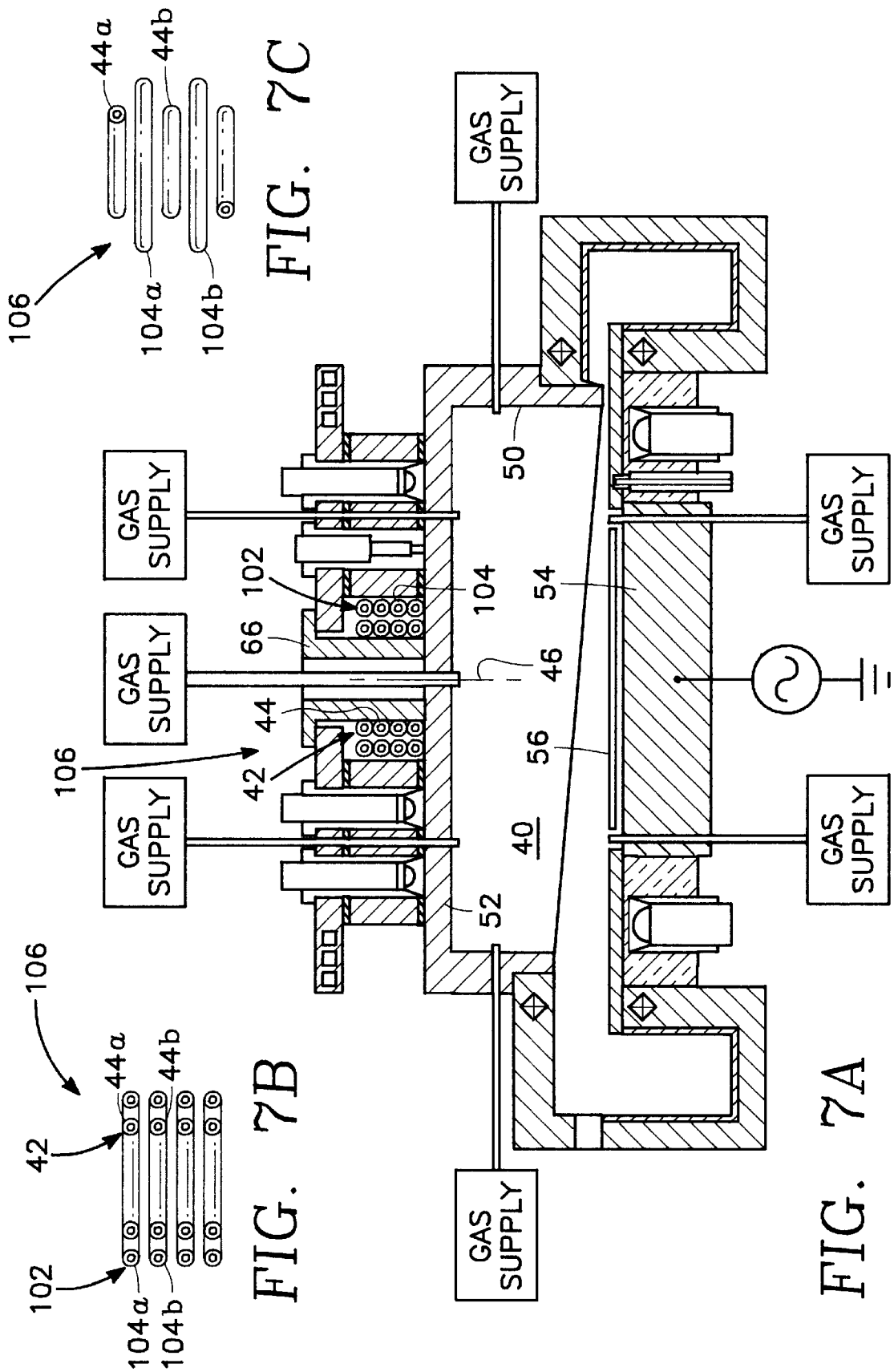
FIG. 7A is a cut-away side view of a plasma reactor in accordance with a third alternative embodiment of the invention corresponding to FIG. 4A in which the center solenoid winding consists of plural upright cylindrical windings.
FIG. 7B is a detailed view of a first implementation of the embodiment of FIG. 7A.
FIG. 7C is a detailed view of a second implementation of the embodiment of FIG. 7A.

FIG. 7A illustrates a variation of the embodiment of FIG. 4A in which the center solenoidal winding includes not only the vertical stack 42 of windings 44 but in addition a second vertical stack 102 of windings 104 closely adjacent to the first stack 42 so that the two stacks constitute a double-wound solenoid 106. Referring to FIG. 7B, the doubly wound solenoid 106 may consist of two independently wound single solenoids 42, 102, the inner solenoid 42 consisting of the windings 44*a*, 44*b*, and so forth and the outer solenoid 102 consisting of the winding 104*a*, 104*b* and so forth. Alternatively, referring to FIG. 7C, the doubly wound solenoid 106 may consist of vertically stacked pairs of at least nearly co-planar windings. In the alternative of FIG. 7C, each pair of nearly co-planar windings (e.g., the pair 44*a*, 104*a* or the pair 44*b*, 104*b*) may be formed by helically winding a single conductor. The term "doubly wound" used herein refers to winding of the type shown in either FIG. 7B or 7C. In addition, the solenoid winding may not be merely doubly wound but may be triply wound or more and in general it can consists of plural windings at each plane along the axis of symmetry. Such multiple-wound solenoids may be employed in either one or both the inner and outer solenoids 42, 90 of the dual-solenoid embodiment of FIG. 5.

Figure 8:
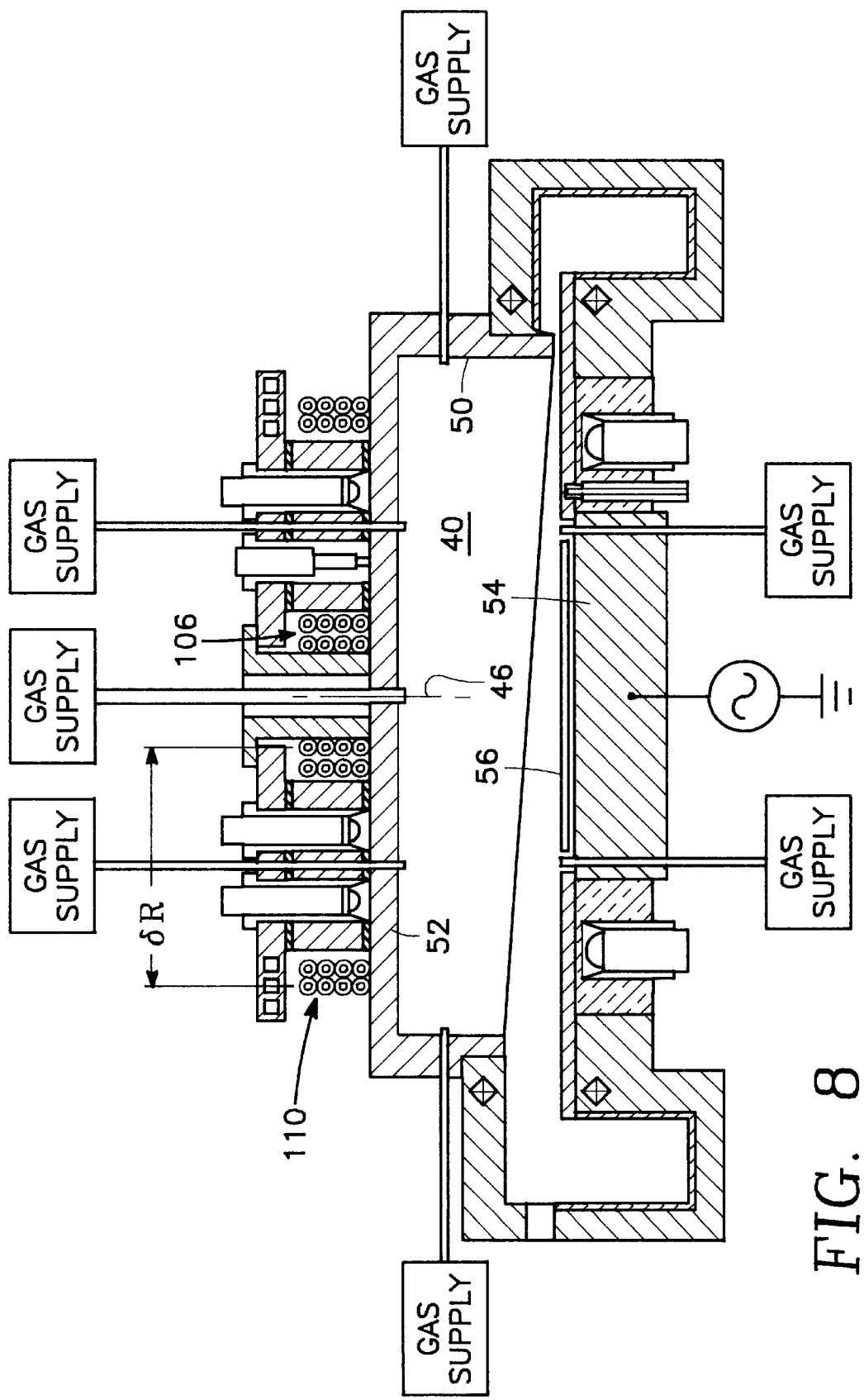
FIG. 8 is a cut-away side view of a plasma reactor in accordance with a fourth alternative embodiment of the invention corresponding to FIG. 5 in which both the inner and outer windings consist of plural upright cylindrical windings.

FIG. 8 illustrates a variation of the embodiment of FIG. 7A in which an outer doubly wound solenoid 110 concentric with the inner doubly wound solenoid 106 is placed at a radial distance δR from the inner solenoid 106.

Figure 9:
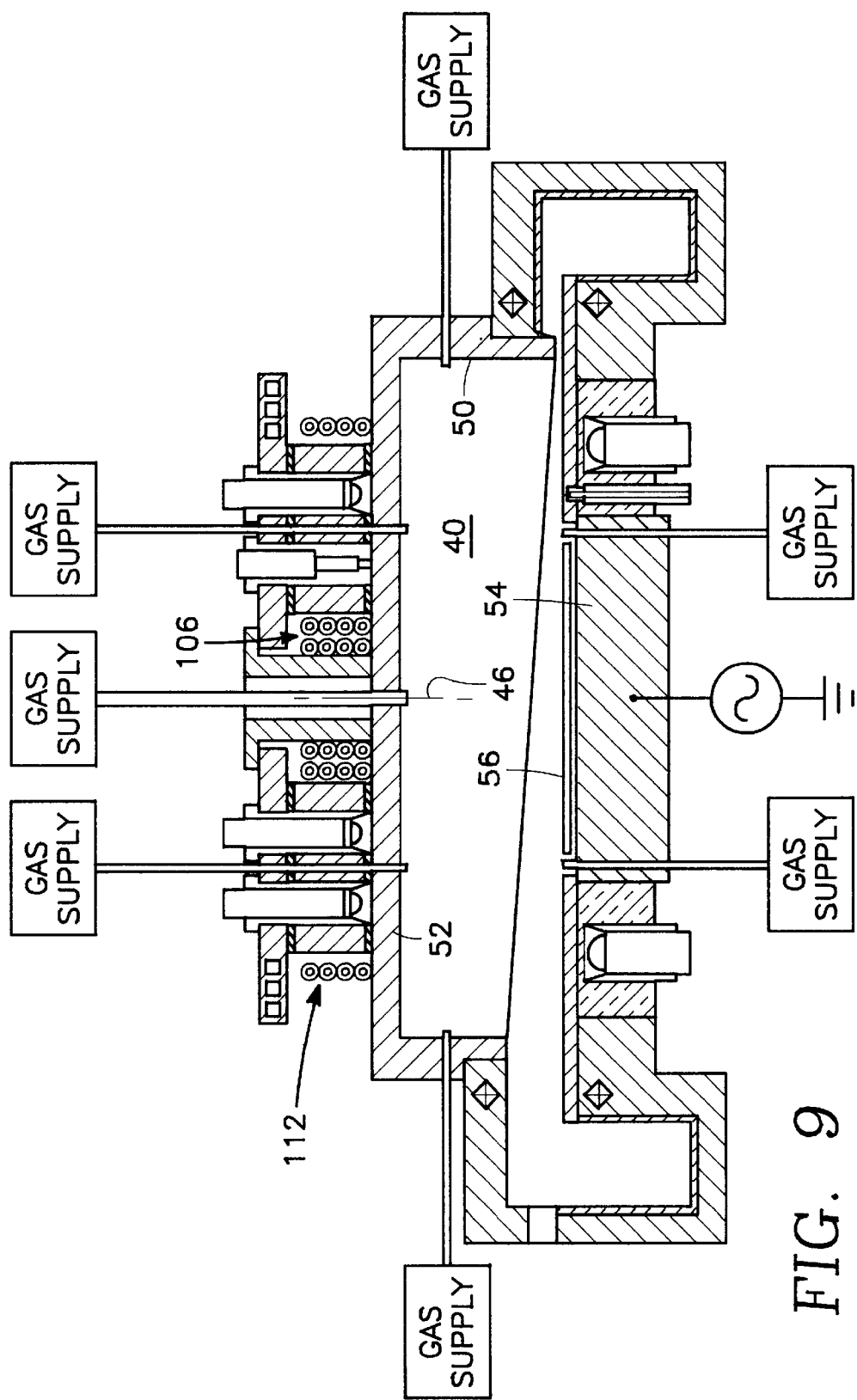
FIG. 9 is a cut-away side view of a plasma reactor in accordance with a fifth alternative embodiment of the invention corresponding to FIG. 5 in which the inner winding consists of plural upright cylindrical windings and the outer winding consists of a single upright cylindrical winding.

FIG. 9 illustrates a variation of the embodiment of FIG. 8 in which the outer doubly wound solenoid 110 is replaced by an ordinary outer solenoid 112 corresponding to the outer solenoid employed in the embodiment of FIG. 5.

Figure 10:
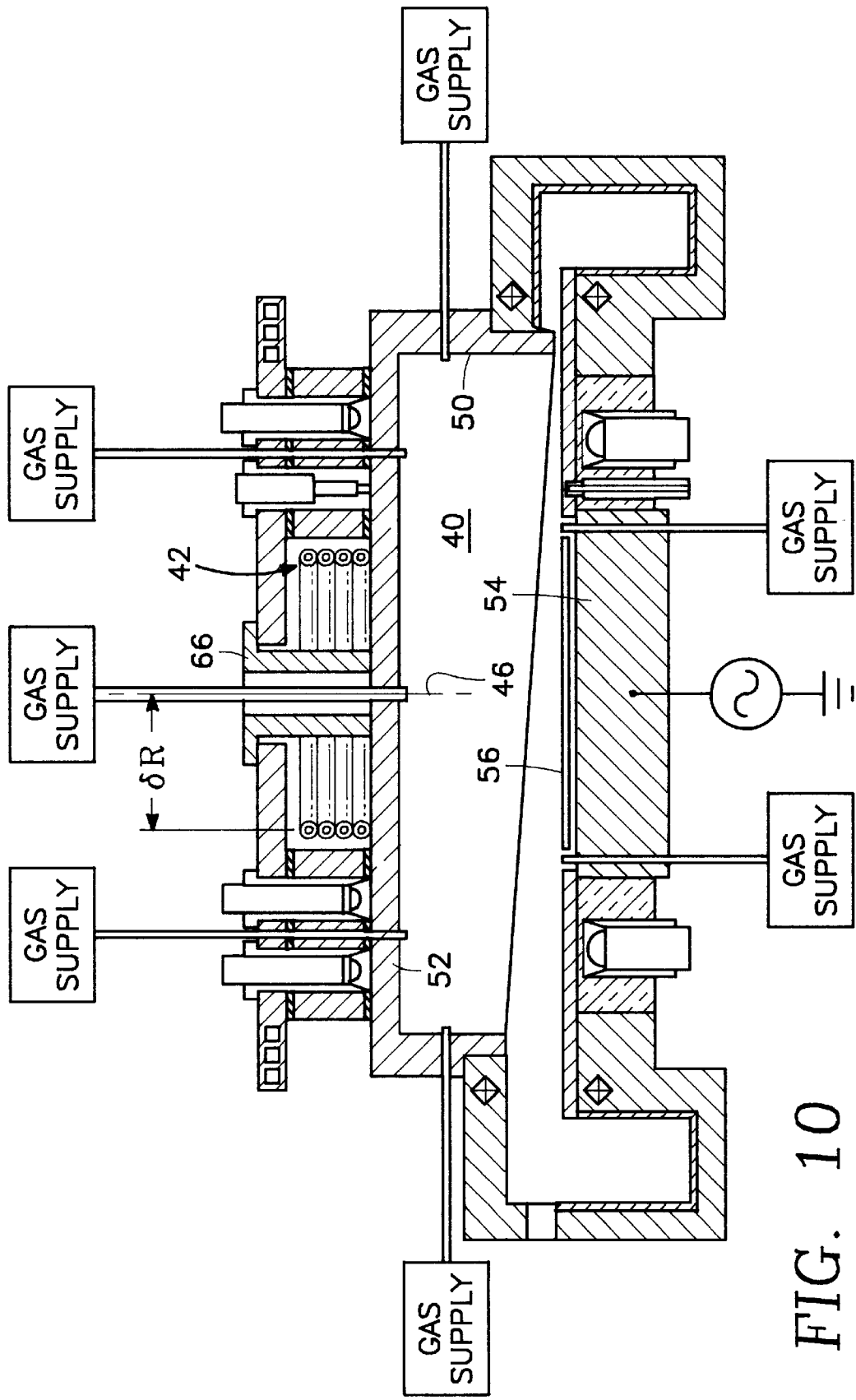
FIG. 10 is a cut-away side view of a plasma reactor in accordance with a sixth alternative embodiment of the invention in which a single solenoid winding is placed at an optimum radial position for maximum plasma ion density uniformity.

FIG. 10 illustrates another preferred embodiment in which the solenoid 42 of FIG. 5 is placed at a location displaced by a radial distance δR from the center gas feed housing 66. In the embodiment of FIG. 4A, δR is zero while in the embodiment of FIG. 10 δR is a significant fraction of the radius of the cylindrical side wall 50. Increasing δR to the extent illustrated in FIG. 10 may be helpful as an alternative to the embodiments of FIGS. 4A, 5, 7A and 8 for compensating for non-uniformities in addition to the usual center dip in plasma ion density described with reference to FIGS. 3D and 3E. Similarly, the embodiment of FIG. 10 may be helpful where placing the solenoid 42 at the minimum distance from the chamber center axis 46 (as in FIG. 4) would so increase the plasma ion density near the center of the wafer 56 as to over-correct for the usual dip in plasma ion density near the center and create yet another non-uniformity in the plasma process behavior. In such a case, the embodiment of FIG. 10 is preferred where δR is selected to be an optimum value which provides the greatest uniformity in plasma ion density. Ideally in this case, δR is selected to avoid both under-correction and over-correction for the usual center dip in plasma ion density. The determination of the optimum value for δR can be carried out by the skilled worker by trial and error steps of placing the solenoid 42 at different radial locations and employing conventional techniques to determine the radial profile of the plasma ion density at each step.

Figure 11:
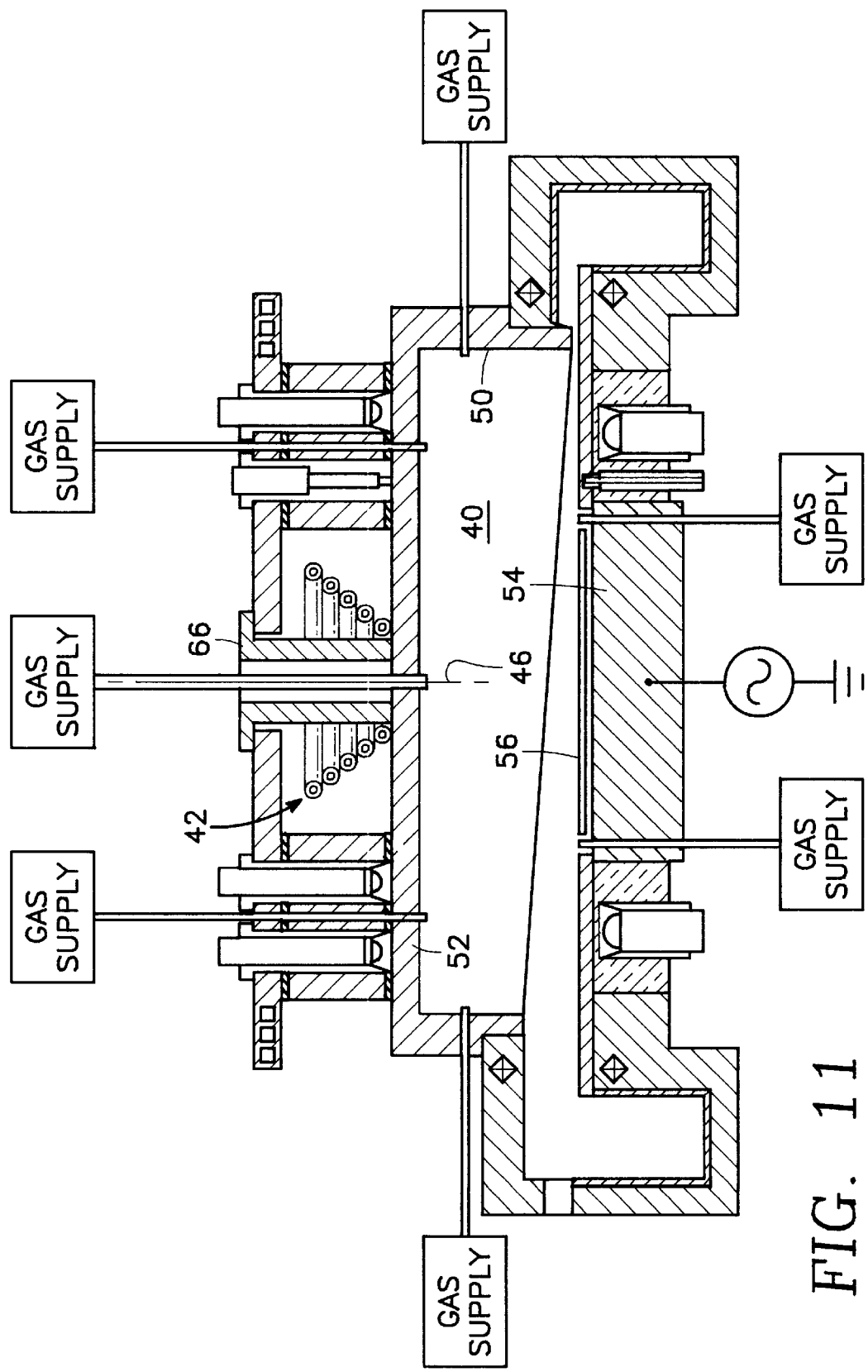
FIG. 11 is a cut-away side view of a plasma reactor in accordance with a seventh alternative embodiment of the invention corresponding to FIG. 4A in which the solenoid winding is an inverted conical shape.
Figure 12:
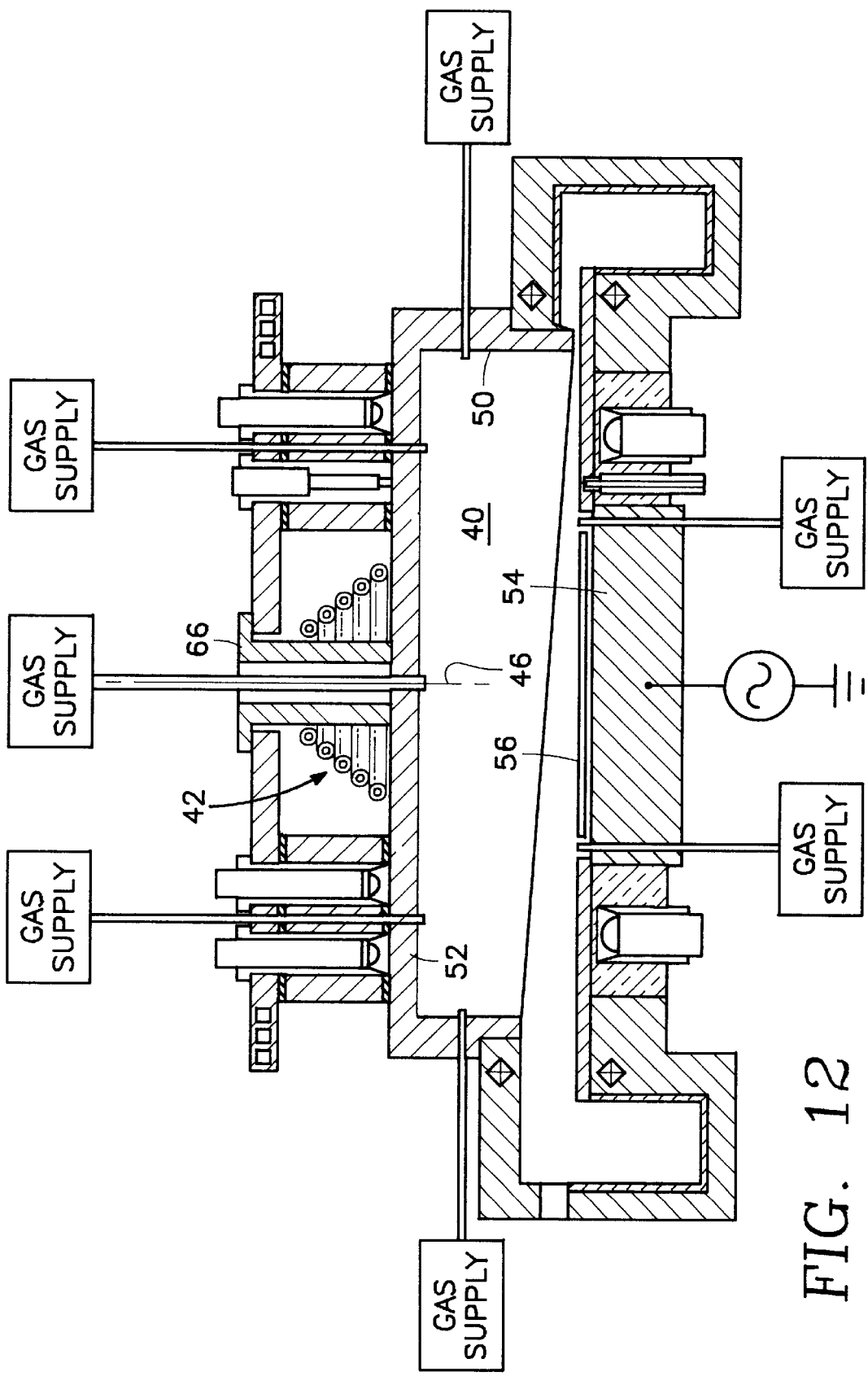
FIG. 12 is a cut-away side view of a plasma reactor in accordance with an eighth alternative embodiment of the invention corresponding to FIG. 4A in which the solenoid winding is an upright conical shape.

FIG. 11 illustrates an embodiment in which the solenoid 42 has an inverted conical shape while FIG. 12 illustrates an embodiment in which the solenoid 42 has an upright conical shape.

Figure 13:
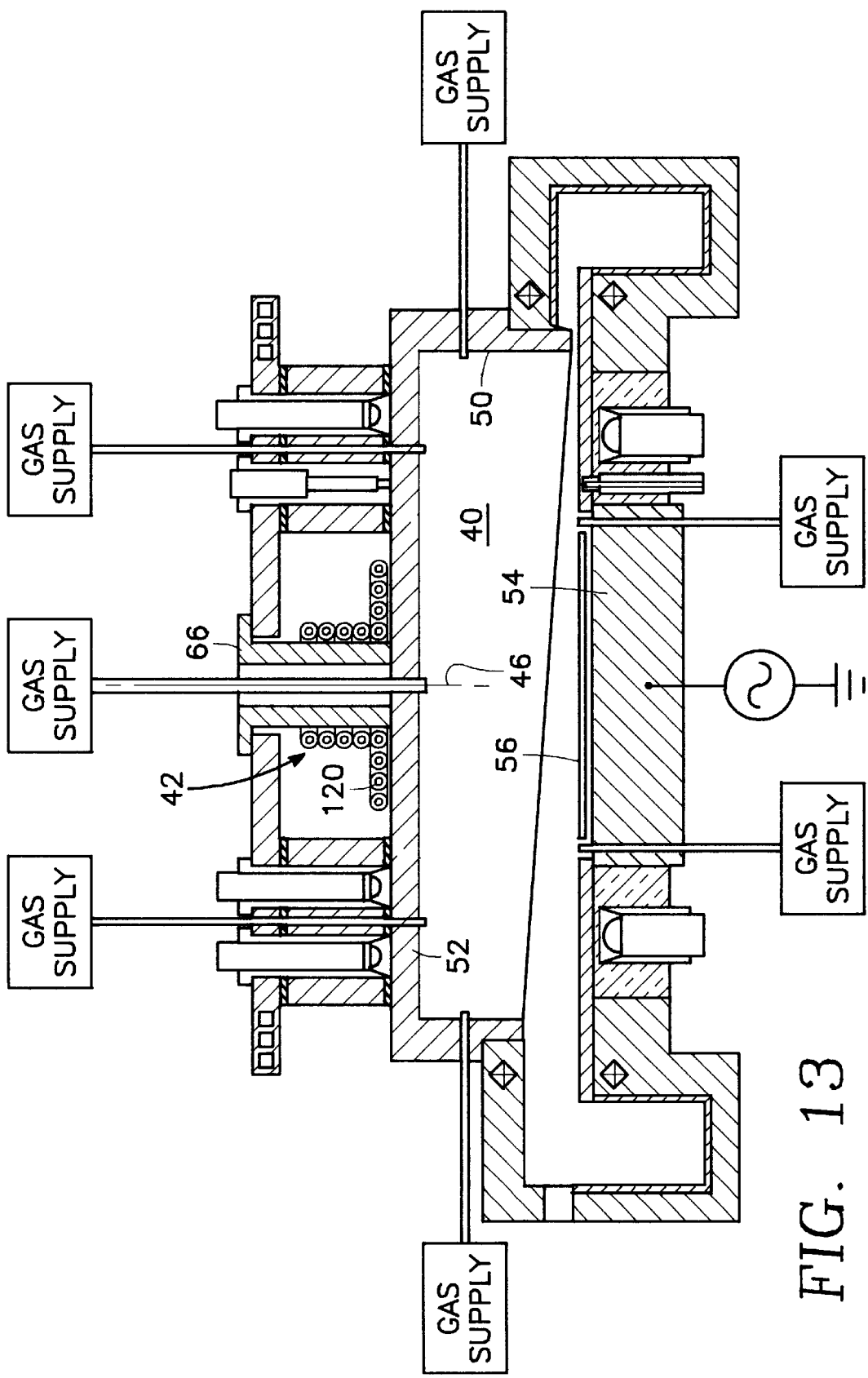
FIG. 13 is a cut-away side view of a plasma reactor in accordance with a ninth alternative embodiment of the invention corresponding to FIG. 4A in which the solenoid winding consists of an inner upright cylindrical portion and an outer flat portion.
Figure 14:
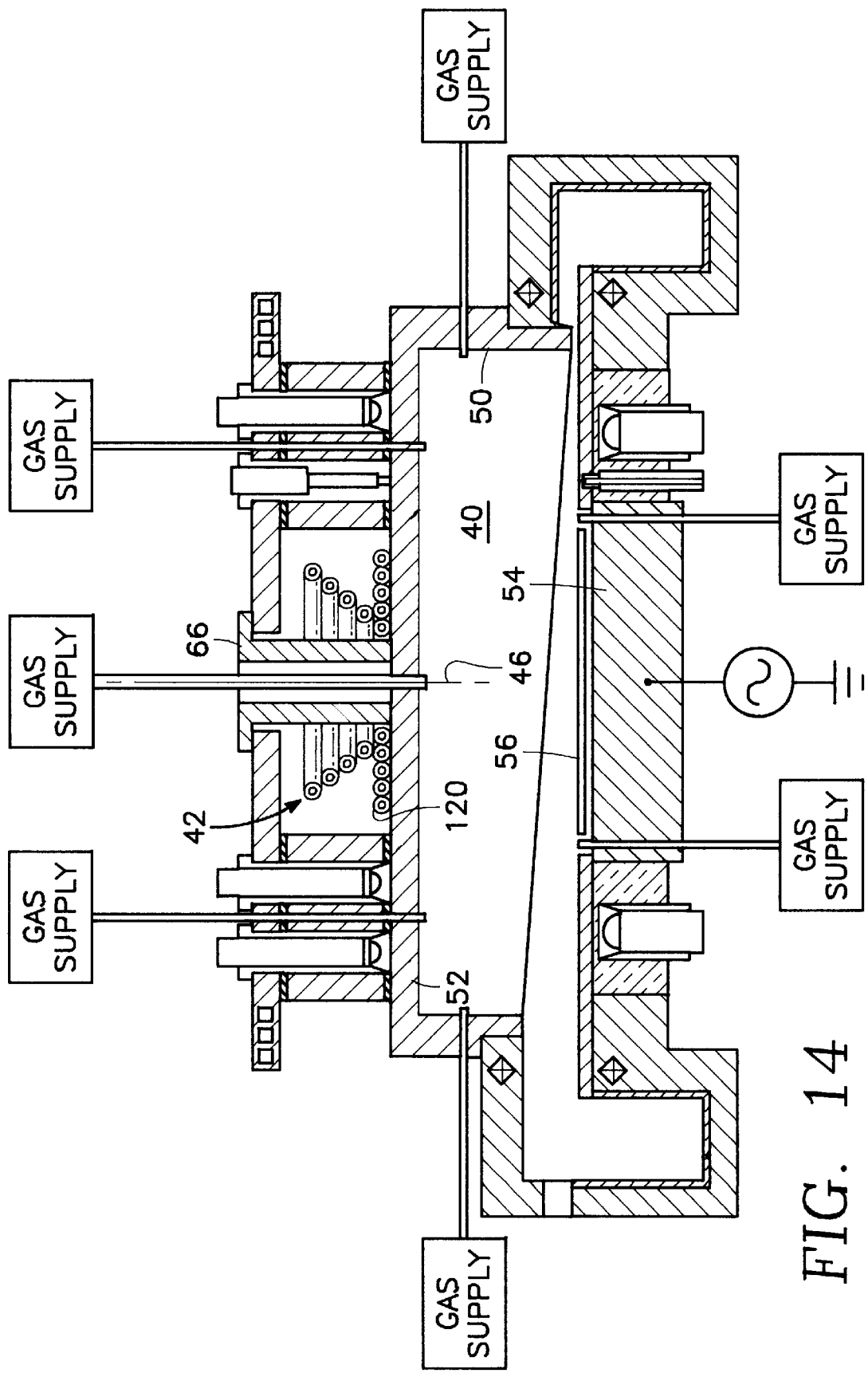
FIG. 14 is a cut-away side view of a plasma reactor in accordance with a tenth alternative embodiment of the invention corresponding to FIG. 10 in which the solenoid winding includes both an inverted conical portion and a flat portion.
Figure 15:
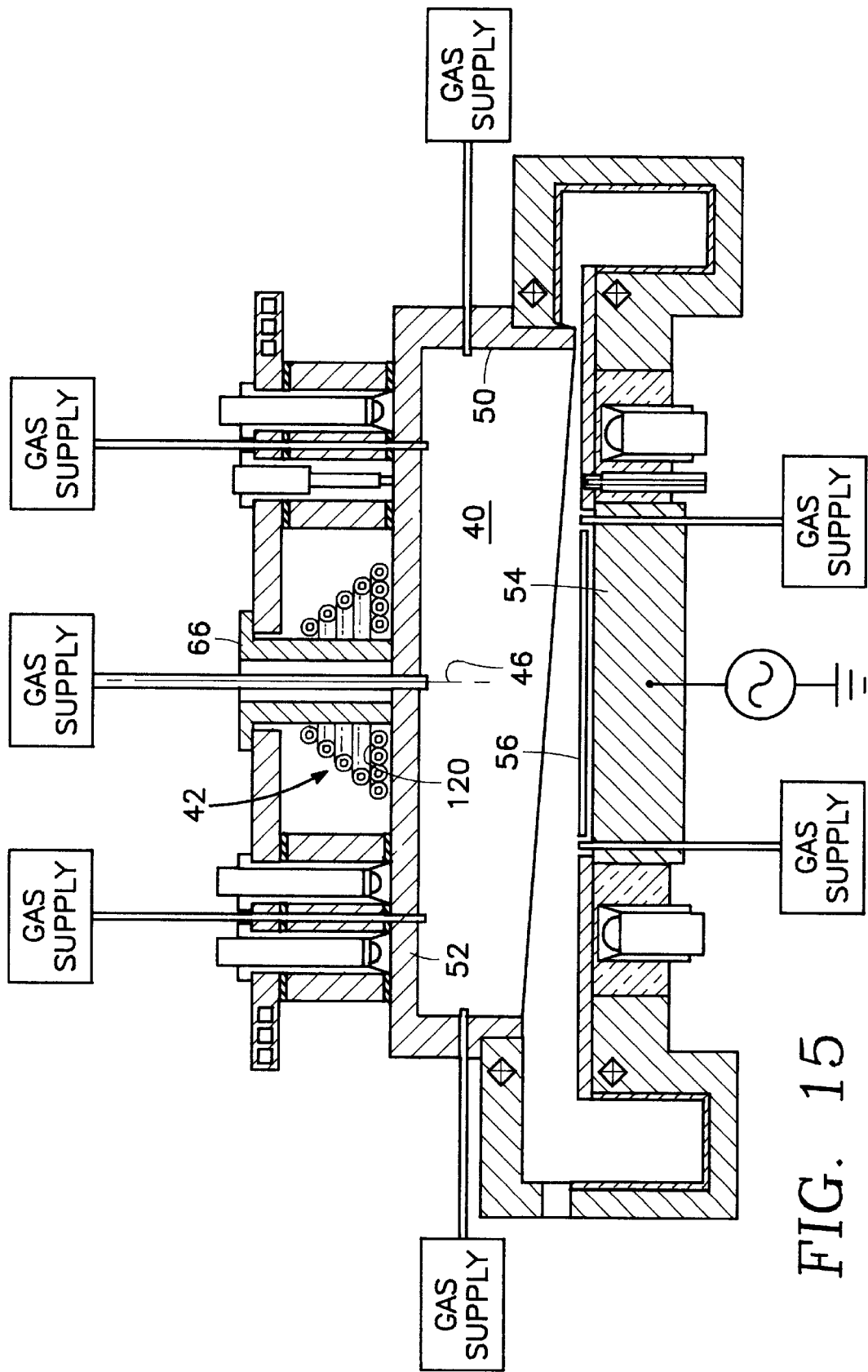
FIG. 15 is a cut-away side view of a plasma reactor in accordance with an eleventh alternative embodiment of the invention corresponding to FIG. 12 in which the solenoid winding includes both an upright conical portion and a flat portion.

FIG. 13 illustrates an embodiment in which the solenoid 42 is combined with a planar helical winding 120. The planar helical winding has the effect of reducing the severity with which the solenoid winding 42 concentrates the induction field near the center of the workpiece by distributing some of the RF power somewhat away from the center. This feature may be useful in cases where it is necessary to avoid overcorrecting for the usual center null. The extent of such diversion of the induction field away from the center corresponds to the radius of the planar helical winding 120. FIG. 14 illustrates a variation of the embodiment of FIG. 13 in which the solenoid 42 has an inverted conical shape as in FIG. 11. FIG. 15 illustrates another variation of the embodiment of FIG. 13 in which the solenoid 42 has an upright conical shape as in the embodiment of FIG. 12.

Figure 16:
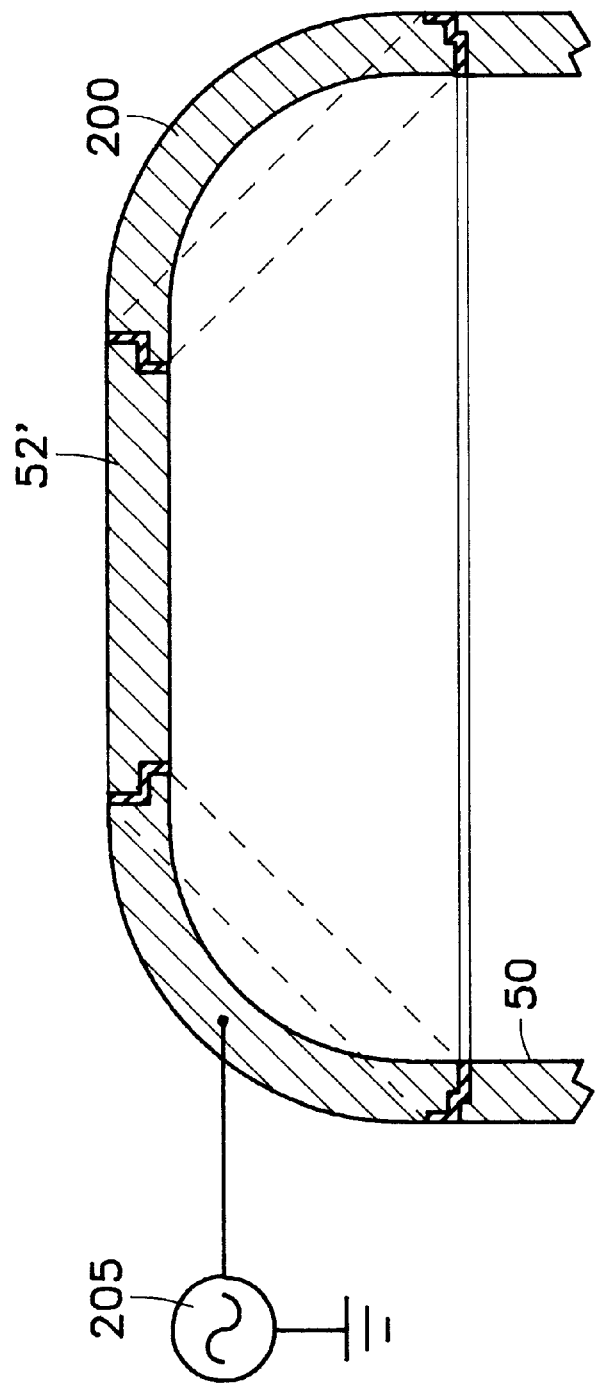
FIG. 16 illustrates another embodiment of the invention employing a combination of planar, conical and dome-shaped ceiling elements.

The RF potential on the ceiling 52 may be increased, for example to prevent polymer deposition thereon, by reducing its effective capacitive electrode area relative to other electrodes of the chamber (e.g., the workpiece and the sidewalls). FIG. 16 illustrates how this can be accomplished by supporting a smaller-area version of the ceiling 52' on an outer annulus 200, from which the smaller-area ceiling 52' is insulated. The annulus 200 may be formed of the same material (e.g., silicon) as the ceiling 52' and may be of a truncated conical shape (indicated in solid line) or a truncated dome shape (indicated in dashed line). A separate RF power supply 205 may be connected to the annulus 200 to permit more workpiece center versus edge process adjustments.

Figure 17A:
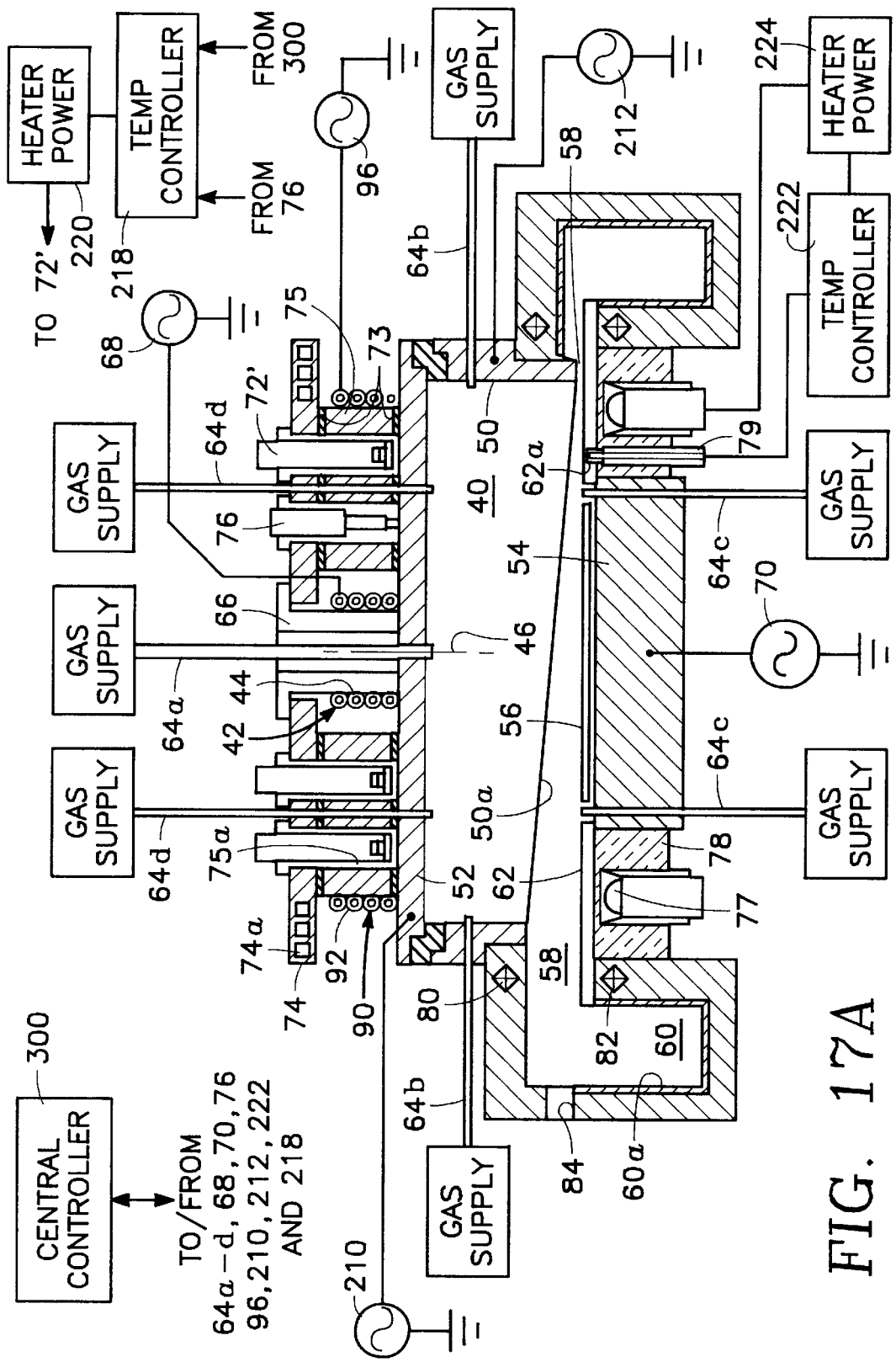
FIG. 17A illustrates an alternative embodiment of the invention employing a separately biased silicon side wall and ceiling and employing electrical heaters.

FIG. 17A illustrates a variation of the embodiment of FIG. 5 in which the ceiling 52 and side wall 50 are separate semiconductor (e.g., silicon) pieces insulated from one another having separately controlled RF bias power levels applied to them from respective RF sources 210, 212 to enhance control over the center etch rate and selectivity relative to the edge. As set forth in greater detail in above-referenced U.S. application Ser. No. 08/597,577 filed Feb. 2, 1996 by Kenneth S. Collins et al., the ceiling 52 may be a semiconductor (e.g.., silicon) material doped so that it will act as an electrode capacitively coupling the RF bias power applied to it into the chamber 40 and simultaneously as a window through which RF power applied to the solenoid 42 may be inductively coupled into the chamber 40. The advantage of such a window-electrode is that an RF potential may be established directly over the wafer 56 (e.g., for controlling ion energy) while at the same time inductively coupling RF power directly over the wafer 56. This latter feature, in combination with the separately controlled inner and outer solenoids 42, 90 and center and peripheral gas feeds 64a, 64b–d greatly enhances the ability to adjust various plasma process parameters such as ion density, ion energy, etch rate and etch selectivity at the workpiece center relative to the workpiece edge to achieve an optimum uniformity. In this combination, the respective gas flow rates through individual gas feeds are individually and separately controlled to achieve such optimum uniformity of plasma process parameters.

FIG. 17A illustrates how the lamp heaters 72 may be replaced by electric heating elements 72'. As in the embodiment of FIG. 4A, the disposable silicon member is an annular ring 62 surrounding the pedestal 54.

Figure 17B:
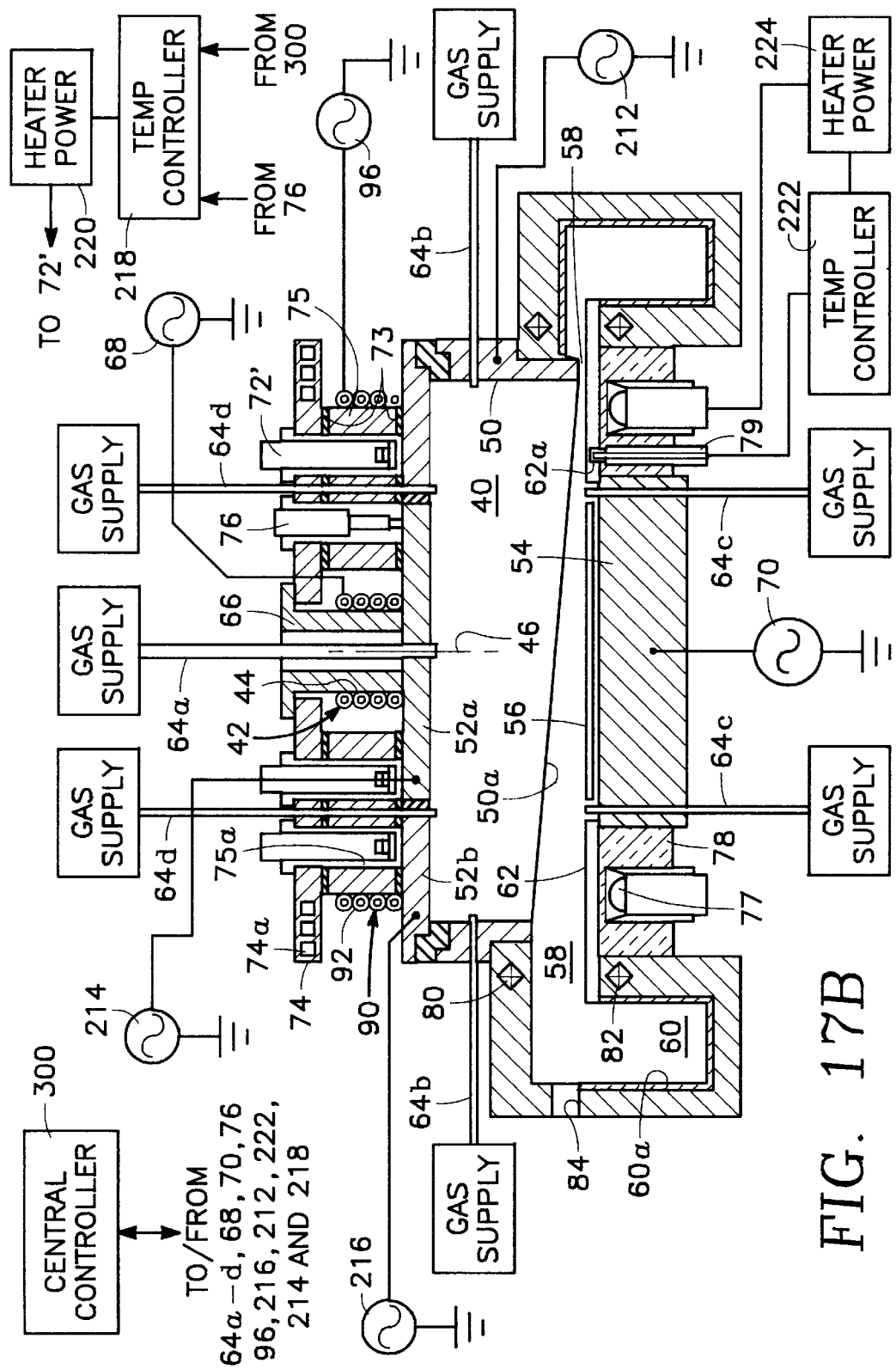
FIG. 17B illustrates an alternative embodiment of the invention employing separately biased inner and outer silicon ceiling portions and employing electrical heaters.

FIG. 17B illustrates another variation in which the ceiling 52 itself may be divided into an inner disk 52a and an outer annulus 52b electrically insulated from one another and separately biased by independent RF power sources 214, 216 which may be separate outputs of a single differentially controlled RF power source.

In accordance with an alternative embodiment, a user-accessible central controller 300 shown in FIGS. 17A and 17B, such as a programmable electronic controller including, for example, a conventional microprocessor and memory, is connected to simultaneously control gas flow rates through the central gas feed 64a and the peripheral gas feeds 64b–d, RF plasma source power levels applied to the inner and outer antennas 42, 90 and RF bias power levels applied to the ceiling 52 and side wall 50 respectively (in FIG. 17A) and the RF bias power levels applied to the inner and outer ceiling portions 52a, 52b (in FIG. 17B), temperature of the ceiling 52 and the temperature of the silicon ring 62. A ceiling temperature controller 218 governs the power applied by a power source 220 to the heaters 72' by comparing the temperature measured by the ceiling temperature sensor 76 with a desired temperature known to the controller 300. A ring temperature controller 222 controls the power applied by a heater power source 224 to the heater lamps 77 facing the silicon ring 62 by comparing the ring temperature measured by the ring sensor 79 with a desired ring temperature stored known to the controller 222. The master controller 300 governs the desired temperatures of the temperature controllers 218 and 222, the RF power levels of the solenoid power sources 68, 96, the RF power levels of the bias power sources 210, 212 (FIG. 17A) or 214, 216 (FIG. 17B), the wafer bias level applied by the RF power source 70 and the gas flow rates supplied by the various gas supplies (or separate valves) to the gas inlets 64a–d. The key to controlling the wafer bias level is the RF potential difference between the wafer pedestal 54 and the ceiling 52. Thus, either the pedestal RF power source 70 or the ceiling RF power source 210 may be simply a short to RF ground. With such a programmable integrated controller, the user can easily optimize apportionment of RF source power, RF bias power and gas flow rate between the workpiece center and periphery to achieve the greatest center-to-edge process uniformity across the surface of the workpiece (e.g., uniform radial distribution of etch rate and etch selectivity). Also, by adjusting (through the controller 300) the RF power applied to the solenoids 42, 90 relative to the RF power difference between the pedestal 54 and ceiling 52, the user can operate the reactor in a predominantly inductively coupled mode or in a predominantly capacitively coupled mode.

While the various power sources connected in FIG. 17A to the solenoids 42, 90, the ceiling 52, side wall 50 (or the inner and outer ceiling portions 52a, 52b as in FIG. 17B) have been described as operating at RF frequencies, the invention is not restricted to any particular range of frequencies, and frequencies other than RF may be selected by the skilled worker in carrying out the invention.

In a preferred embodiment of the invention, the high thermal conductivity spacer 75, the ceiling 52 and the side wall 50 are integrally formed together from a single piece of crystalline silicon.

While the invention has been described as being carried out with a number of separate RF sources, some or all of the RF sources depicted herein may derive their outputs from separate RF generators or from a common RF generator with different outputs at different RF power levels, frequencies and phases synthesized with variable power dividers, frequency multipliers and/or phase delays, as may be appropriate. Moreover, while the invention has been described as being carried out with a number of separate process gas supplies, some or all of the process gas supplies may be derived from a common process gas supply which is divided among the plural separately controlled gas inlets 64.

While the invention has been described in detail by specific reference to preferred embodiments, it is understood that variations and modifications thereof may be made without departing from the true spirit and scope of the invention.

What is claimed is:

1. A plasma reactor comprising:
   a plasma reactor chamber and a workpiece support for holding a workpiece in a workpiece support plane inside said chamber during processing, said chamber having a reactor enclosure portion facing said support; and
   a plurality of nested inductive antennas adjacent said reactor enclosure portion, at least one antenna of said plurality of antennas comprising turns spatially distributed along an axis extending from said support plane and at different distances from said enclosure portion, said plurality of inductive antennas being adapted to couple power into said chamber.

2. The reactor of claim 1, wherein said turns are spatially distributed along said axis so as to compensate for a null in a radiation pattern of said antennas.

3. The reactor of claim 1, further comprising at least one RF plasma source power supply coupled to said inductive antennas.

4. The reactor of claim 1, wherein said at least one antenna has a non-conformal shape.

5. The reactor of claim 1, wherein said at least one antenna is spatially distributed along said axis so as to be capable of providing plasma uniformity across the workpiece for distances on the order of a skin depth in the plasma of an inductive field of said plurality of antennas.

6. The reactor of claim 1, wherein said plurality of nested inductive antennas comprises:
   an inner inductive antenna; and
   an outer inductive antenna displaced by a radial distance from said inner antenna.

7. The reactor of claim 6, wherein said outer inductive antenna comprises turns spatially distributed in a direction transverse to said support plane.

8. The reactor of claims 9 further comprising respective independent gas feeds with respective gas outlets near center and peripheral portions, respectively, of said support plane.

9. The reactor of claim 8, wherein said reactor chamber enclosure comprises separately RF biased inner and outer electrode windows near center and peripheral portions, respectively, of said support plane, for admitting inductance fields of the inductive antenna into said chamber.

10. The reactor of claim 9, wherein said separately biased inner and outer electrode windows comprise a semiconductor material.

11. The reactor of claim 6, further comprising a first RF power supply coupled to said inner antenna and a second RF power supply coupled to said outer antenna.

12. The reactor of claim 1 further comprising an expendable removable scavenger precursor member.

13. The reactor of claim 1, wherein said reactor enclosure portion comprises a ceiling, said ceiling overlying said workpiece support and underlying said at least one antenna.

14. The reactor of claim 13, wherein said at least one inductive antenna is spatially distributed along said axis so as to be capable of providing plasma uniformity for distances on the order of a skin depth of an RF inductive field of said plurality of antennas through the plasma in said chamber.

15. The reactor of claim 13, wherein said ceiling has a shape comprising at least one of the following: (a) planar, (b) dome, (c) conical, (d) cylindrical, (e) curve of rotation, or (f) truncated conical.

16. The reactor of claim 15, wherein said ceiling and workpiece support are separated by a distance which is on the order of 10 electron mean free path lengths in a plasma in said chamber.

17. The reactor of claim 13, wherein said ceiling comprises a semiconductor window electrode underlying said at least one antenna.

18. The reactor of claim 17 further comprising an RF bias source coupled to said ceiling.

19. The reactor of claim 17, wherein said plurality of antennas comprises an inner antenna overlying said ceiling and concentrated in a region overlying a center portion of said workpiece and an outer antenna spaced from said inner antenna.

20. The plasma reactor of claim 1, wherein said plurality of nested inductive antennas comprises concentric antennas.

21. The plasma reactor of claim 20, wherein more than one of said plurality of antennas comprises turns spatially distributed along an axis extending from said support plane and at different distances from said enclosure portion.

22. The plasma reactor of claim 21, wherein all of said plurality of antennas comprise turns spatially distributed along an axis extending from said support plane and at different distances from said enclosure portion.

23. The plasma reactor of claim 1, wherein more than one of said plurality of antennas comprises turns spatially distributed along an axis extending from said support plane and at different distances from said enclosure portion.

24. The plasma reactor of claim 1, wherein all of said plurality of antennas comprise turns spatially distributed along an axis extending from said support plane and at different distances from said enclosure portion.

25. The plasma reactor of claim 1, wherein said plurality of antennas comprise at least one solenoid-like antenna.

26. The reactor of claim 25, wherein said at least one antenna comprises a vertical stack of turns.

27. The reactor of claim 26, wherein said vertical stack of turns comprises at least one of: a right cylindrical shape; an upright conical shape; or an inverted conical shape.

28. The reactor of claim 27 further comprising planar turns extending radially outwardly from a bottom turn of said vertical stack of turns.

29. The reactor of claim 26, wherein said solenoid-like antenna comprises a doubly wound solenoid antenna.

30. The reactor of claim 29 further comprising a second solenoid antenna adjacent said reactor enclosure at an outer radial location relative to said doubly wound solenoid antenna.

31. The reactor of claim 25, wherein said plurality of antennas comprises a pair of concentric single solenoid antennas.

32. The reactor of claim 1, wherein said at least one antenna has an annular cross-section having a width which is a small fraction of said reactor enclosure portion.

33. The reactor of claim 32, wherein each of said plurality of antennas has an annular cross-section having a width which is a small fraction of said reactor enclosure portion.

34. The reactor of claim 1, wherein said plasma chamber comprises a ceiling, and wherein said ceiling comprises a semiconductor window electrode underlying said at least one antenna.

35. The reactor of claim 34, wherein said plasma reactor chamber comprises a side wall underlying said ceiling, and wherein said side wall is formed of semiconductor material.

36. The reactor of claim 35 wherein said plasma chamber is an all-semiconductor chamber.

37. The reactor of claim 36 wherein said at least one inductive antenna is spatially distributed along said axis so as to be capable of providing plasma uniformity for distances on the order of a skin depth in the plasma of an induction field of said plurality of inductive antennas.

38. The reactor of claim 24 wherein said plurality of antennas comprises a solenoid-like antenna.

39. The reactor of claim 38 wherein said at least one antenna comprises a vertical stack.

40. The reactor of claim 39 wherein said plurality of antennas comprises a plurality of concentric solenoidal antennas.

41. The reactor of claim 40 wherein said at least one inductive antenna is spatially distributed along said axis so as to be capable of providing plasma uniformity for distances on the order of a skin depth in the plasma of an induction field of said plurality of inductive antennas.

42. A plasma reactor comprising:
a plasma reactor chamber and a workpiece support for holding a workpiece in a workpiece support plane inside said chamber during processing, said chamber having a reactor enclosure portion facing said support;
a plurality of nested inductive antennas adjacent said reactor enclosure portion, at least one antenna of said plurality of antennas comprising turns spatially distributed along an axis extending from said support plane and at different distances from said enclosure portion, said plurality of inductive antennas being adapted to couple power into said chamber, wherein said plurality of nested inductive antenna comprises:
an inner inductive antenna; and
an outer inductive antenna displaced by a radial distance from said inner antenna, said outer inductive antenna comprising turns spatially distributed in a direction transverse to said support plane;
respective independent gas feeds with respective gas outlets near center and peripheral portions, respectively, of said support plane;
wherein said reactor chamber enclosure comprises separately RF biased inner and outer electrode windows near center and peripheral portions, respectively, of said support plane, for admitting inductance fields of the inductive antenna into said chamber; and
a heater overlying at least one of said inner and outer electrode windows and a cold plate overlying at least one of said electrode windows.

43. The reactor of claim 42, wherein said heater comprises plural heater elements, said reactor further comprising a thermally conductive member sandwiched between said cold plate and said at least one of said inner and outer electrode windows, said sandwiched member having respective axial holes therein containing respective ones of said heater elements.

44. The reactor of claim 43, wherein said heater elements comprise respective radiant lamps.

45. A plasma reactor comprising:
a plasma reactor chamber and a workpiece support for holding a workpiece in a workpiece support plane inside said chamber during processing, said chamber having a reactor enclosure portion facing said support;
a plurality of nested inductive antennas adjacent said reactor enclosure portion, at least one antenna of said plurality of antennas comprising turns spatially distributed along an axis extending from said support plane and at different distances from said enclosure portion, said plurality of inductive antennas being adapted to couple power into said chamber; and
a heater overlying said reactor enclosure and a cold plate overlying said reactor enclosure.

46. The reactor of claim 45, wherein said heater comprises plural heater elements, said reactor further comprising a thermally conductive member sandwiched between said cold plate and said reactor enclosure, said sandwiched member having respective axial holes therein containing respective ones of said heater elements.

47. The reactor of claim 46, wherein said heater elements comprise respective radiant lamps.

48. A plasma reactor comprising:
a plasma reactor chamber and a workpiece support for holding a workpiece in a workpiece support plane inside said chamber during processing, said chamber having a reactor enclosure portion facing said support;
a plurality of nested inductive antennas adjacent said reactor enclosure portion, at least one antenna of said plurality of antennas comprising turns spatially distributed along an axis extending from said support plane and at different distances from said enclosure portion, said plurality of inductive antennas being adapted to couple power into said chamber;
an expendable removable scavenger precursor member; and
a precursor member heater adjacent said expendable member.

49. The reactor of claim 48 further comprising a heater window sandwiched between said precursor member heater and said expendable member.

50. The reactor of claim 49, wherein said precursor member heater comprises respective radiant lamps.

51. A plasma reactor comprising:
a plasma reactor chamber and a workpiece support for holding a workpiece in a workpiece support plane inside said chamber during processing, said chamber having a reactor enclosure portion facing said support;
a plurality of nested inductive antennas, including inner and outer antennas, adjacent said reactor enclosure portion, at least one antenna of said plurality of antennas comprising turns spatially distributed along an axis extending from said support plane and at different distances from said enclosure portion, said plurality of inductive antennas being adapted to couple power into said chamber;

said reactor enclosure portion comprising a ceiling, said ceiling overlying said workpiece support and underlying said at least one antenna, said ceiling comprising a semiconductor window electrode underlying said at least one antenna;

an RF bias source coupled to said ceiling; and a heater disposed over a space on said ceiling between said inner and outer antennas.

52. The reactor of claim 51 further comprising a controller governing respective RF power levels applied to each of said inner and outer antennas relative to the other.

53. The reactor of claim 52 further comprising a user-accessible central controller for controlling center and peripheral RF source power applied to said inner and outer antennas respectively, to optimize workpiece center-to-edge processing uniformity.

54. The reactor of claim 52, wherein said reactor chamber further comprises a peripheral enclosure portion nearer a peripheral portion of said support plane than said ceiling and insulated from said ceiling, said ceiling and said peripheral enclosure portion being adapted to separately controlled respective levels of RF power applied thereto.

55. The reactor of claim 54 further comprising a user-accessible central controller for controlling center and peripheral RF source power applied to said inner and outer antennas respectively, and center and peripheral RF bias applied to said ceiling and peripheral enclosure portion respectively to optimize workpiece center-to-edge processing uniformity.

56. The reactor of claim 54 further comprising respective center and peripheral gas feeds for independently controlling process gas flow near the center and peripheral portions, respectively, of said workpiece.

57. The reactor of claim 56 further comprising a user-accessible central controller for controlling center and peripheral gas flow through said center and peripheral gas feeds respectively, center and peripheral RF source power applied to said inner and outer antennas respectively, and center and peripheral RF bias applied to said ceiling and peripheral enclosure portion respectively to optimize workpiece center-to-edge processing uniformity.

58. The reactor of claim 52, wherein said controller governs a phase angle between RF power applied to said inner and outer antennas.

59. The reactor of claim 58, wherein said phase angle is fixed.

60. The reactor of claim 59, wherein said phase angle is such that fields produced by said inner and outer antennas add constructively.

61. The reactor of claim 58, wherein said phase angle is variable.

62. The reactor of claim 61, wherein said controller maintains a respective frequency of RF power applied to each antenna of said plurality of antennas at a resonant frequency of each antenna loaded by a plasma in said chamber.

63. The reactor of claim 62, wherein said controller drives each antenna of said plurality of antennas at different frequencies.

64. The reactor of claim 63, wherein said different frequencies lie in respective mutually exclusive frequency ranges.

* * * * *